(12) United States Patent
Ridder

(10) Patent No.: US 9,496,862 B2
(45) Date of Patent: Nov. 15, 2016

(54) CIRCUIT ARRANGEMENT FOR ACTUATING A SEMICONDUCTOR SWITCHING ELEMENT

(71) Applicant: Conti Temic microelectronic GmbH, Nuremberg (DE)

(72) Inventor: Matthias Ridder, Eckental (DE)

(73) Assignee: CONTI TEMIC MICROELECTRONIC GMBH, Nuremberg (DE)

( * ) Notice: Subject to any disclaimer, the term of this patent is extended or adjusted under 35 U.S.C. 154(b) by 188 days.

(21) Appl. No.: 14/397,732

(22) PCT Filed: Apr. 23, 2013

(86) PCT No.: PCT/EP2013/058371
§ 371 (c)(1),
(2) Date: Oct. 29, 2014

(87) PCT Pub. No.: WO2013/164222
PCT Pub. Date: Nov. 7, 2013

(65) Prior Publication Data
US 2015/0124507 A1    May 7, 2015

(30) Foreign Application Priority Data
Apr. 30, 2012    (DE) ......................... 10 2012 207 155

(51) Int. Cl.
*H02M 7/217*    (2006.01)
*H03K 17/0416*    (2006.01)
(Continued)

(52) U.S. Cl.
CPC ......... *H03K 17/0406* (2013.01); *H02M 7/217* (2013.01); *H03K 17/04123* (2013.01);
(Continued)

(58) Field of Classification Search
CPC ............... H02M 7/217; H03K 17/0406; H03K 17/04123; H03K 17/04163; H03K
(Continued)

(56) References Cited

U.S. PATENT DOCUMENTS 4,052,623 A    10/1977  Loberg ........................ 327/304
5,763,962 A *   6/1998  Tsurumi ............. H03K 17/0822
                                                    307/129
(Continued)

FOREIGN PATENT DOCUMENTS

DE          4441492 A1      5/1996    ............ H02M 7/538
DE         69720176 T2     10/2003    ................ H02J 7/10
(Continued)

OTHER PUBLICATIONS

International Search Report and Written Opinion, Application No. PCT/EP2013/058371, 19 pages, Oct. 10, 2013.

*Primary Examiner* — Jessica Han
*Assistant Examiner* — Bart Iliya
(74) *Attorney, Agent, or Firm* — Slayden Grubert Beard PLLC

(57) ABSTRACT

A switching arrangement for triggering a semiconductor switching element with a first electrode, a second electrode and a control electrode includes: a pulse generator for generating a control voltage input signal; a bias voltage capacitor; a first electrical resistor electrically connected in series with the bias voltage capacitor between first and second terminals of the pulse generator, wherein the control electrode is electrically connected to the bias voltage capacitor and the first electrical resistor, and the first electrode is electrically connected to the pulse generator and the first electrical resistor; and an additional capacitor connected in series to the pulse generator, the first electrical resistor, and the bias voltage capacitor.

20 Claims, 20 Drawing Sheets

(51) Int. Cl.
*H03K 17/06* (2006.01)
*H03K 17/691* (2006.01)
*H03K 17/04* (2006.01)
*H03K 17/0412* (2006.01)

(52) U.S. Cl.
CPC ...... H03K 17/04163 (2013.01); H03K 17/063 (2013.01); H03K 17/691 (2013.01); *H03K 2017/066* (2013.01)

(58) Field of Classification Search
CPC .......................... 17/063;H03K 17/691; H03K 2017/066
See application file for complete search history.

(56) References Cited

U.S. PATENT DOCUMENTS

| | | | | |
|---|---|---|---|---|
| 5,786,687 A * | 7/1998 | Faulk | .................... | H02M 3/155 |
| | | | | 323/289 |
| 6,016,259 A | 1/2000 | Tamura et al. | ............. | 363/21.02 |
| 6,094,087 A * | 7/2000 | He | ...................... | H02M 1/4225 |
| | | | | 327/376 |
| 2011/0285447 A1* | 11/2011 | Nakanishi | ................ | H03K 5/08 |
| | | | | 327/326 |
| 2012/0008344 A1* | 1/2012 | Zeng | .................. | H03K 17/6877 |
| | | | | 363/21.11 |

FOREIGN PATENT DOCUMENTS

| | | | | |
|---|---|---|---|---|
| DE | 102005029353 A1 | 12/2006 | .............. | H02M 1/08 |
| JP | 2010130786 A | 6/2010 | .............. | H02M 1/08 |
| WO | 2013/164222 A1 | 11/2013 | ......... | H03K 17/0412 |

* cited by examiner

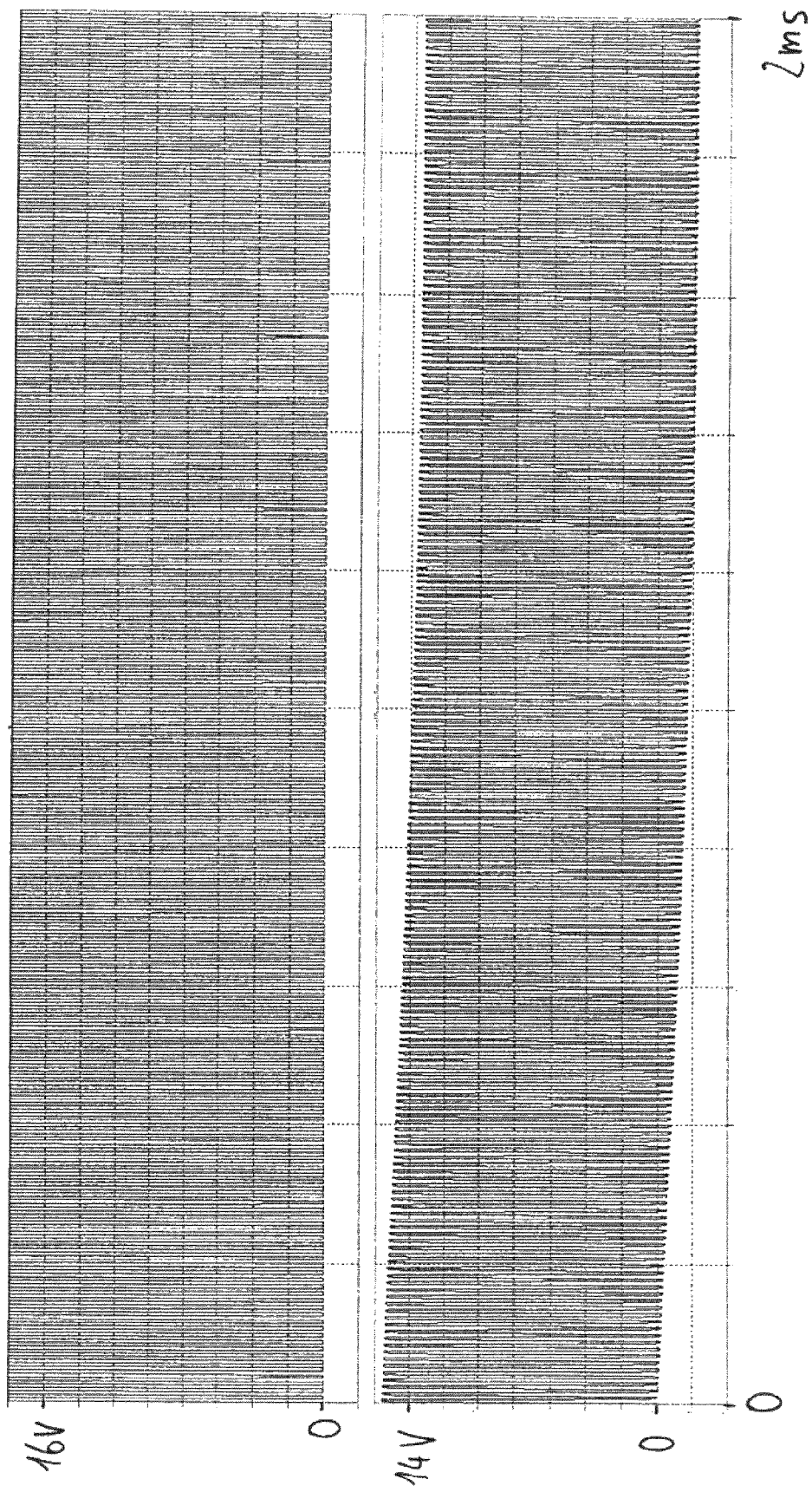

CIRCUIT ARRANGEMENT FOR ACTUATING A SEMICONDUCTOR SWITCHING ELEMENT

CROSS-REFERENCE TO RELATED APPLICATIONS

This application is a U.S. National Stage Application of International Application No. PCT/EP2013/058371 filed Apr. 23, 2013, which designates the United States of America, and claims priority to DE Application No. 10 2012 207 155.5 filed Apr. 30, 2012, the contents of which are hereby incorporated by reference in their entirety.

TECHNICAL FIELD

The application relates to a circuit arrangement for actuating a first voltage-controlled semiconductor switching element and to a bridge circuit and a power converter comprising such a circuit arrangement.

BACKGROUND

DE 697 20 176 T2 discloses a power supply circuit comprising a current source, a power transformer whose secondary side is connected to a circuit arrangement to which power is to be supplied from the power supply circuit, and a voltage-controlled switching element comprising a control connection. In addition, the power supply circuit contains an LC resonant circuit, which is connected in series with the switching element and whose inductance forms the first winding of the power transformer, a feedback winding for supplying a feedback voltage corresponding to a radiofrequency current of the LC resonant circuit to the control connection of the switching element and a bias circuit, which is connected in parallel with the series circuit comprising the LC resonant circuit and the switching element and is connected to the feedback winding in order to supply a bias to the control connection via the feedback winding. Furthermore, the power supply circuit has a bias control circuit for controlling the bias which is connected between the bias circuit and the series circuit comprising the LC resonant circuit and the switching element, and a resistor, which is connected to the control connection of the switching element, wherein the bias and the feedback voltage are supplied to the control connection of the switching element via the resistor, and wherein the resistor is selected to delay the feedback voltage by a preset time period.

SUMMARY

One embodiment provides a circuit arrangement for actuating a first voltage-controlled semiconductor switching element comprising a first electrode, a second electrode, and a control electrode, the circuit arrangement comprising: a pulse generator configured to generate a control voltage input signal for actuating the first semiconductor switching element, wherein the control voltage input signals contain a switch-on voltage signal for switching on the first semiconductor switching element and a switch-off voltage signal for switching off the first semiconductor switching element; a bias capacitor electrically connected to the pulse generator such that the bias capacitor is configured to vary an amplitude of a switch-off voltage signal to the control electrode; a first electrical resistor connected electrically in series with the bias capacitor in an electrical path between a first connection of the pulse generator and a second connection of the pulse generator, wherein the control electrode is electrically connected to a first connection of the bias capacitor and to a first connection of the first electrical resistor, and wherein the first electrode is electrically connected to a second connection of the pulse generator and to a second connection of the first electrical resistor; and a further capacitor connected electrically in series with the first electrical resistor and the bias capacitor in the electrical path between the first connection of the pulse generator and the second connection of the pulse generator.

In a further embodiment, the bias capacitor is configured to vary the amplitude of the switch-off voltage signal to the control electrode such way that the switch-off voltage signal has a polarity which is opposite that of a switch-on voltage signal.

In a further embodiment, the circuit arrangement comprises a first diode connected electrically in series with the first electrical resistor and the bias capacitor in the electrical path between the first connection of the pulse generator and the second connection of the pulse generator.

In a further embodiment, the first electrical resistor and the first diode are integrated monolithically in the circuit arrangement.

In a further embodiment, the bias capacitor has a first capacitance $C_1$ and the capacitor has a third capacitance $C_3$ that substantially corresponds to the first capacitance $C_1$.

In a further embodiment, the first semiconductor switching element comprises a MOSFET, and wherein the first electrode forms a source electrode, the second electrode forms a drain electrode and the control electrode forms a gate electrode of the MOSFET.

In a further embodiment, the first semiconductor switching element comprises an IGBT, and wherein the first electrode forms an emitter electrode, the second electrode forms a collector electrode and the control electrode forms a gate electrode of the IGBT.

In a further embodiment, the circuit arrangement further comprises a discharge circuit configured to discharge the control electrode, wherein the discharge circuit is connected electrically in parallel with the bias capacitor and has a second electrical resistor and a second semiconductor switching element.

In a further embodiment, the circuit arrangement further comprises a second diode connected electrically in parallel with the bias capacitor, wherein the first electrical resistor is connected electrically in series with the parallel circuit comprising the second diode and the bias capacitor in the electrical path between the first connection of the pulse generator and the second connection of the pulse generator.

In a further embodiment, the second diode comprises a Zener diode.

Another embodiment provides a power converter comprising a circuit arrangement as disclosed above.

BRIEF DESCRIPTION OF THE DRAWINGS

Example embodiments are explained in more detail below with reference to the attached figures, in which:

FIGS. 6A and 6B show voltage-time graphs for a first set of parameters;

DETAILED DESCRIPTION

Figure 1A:
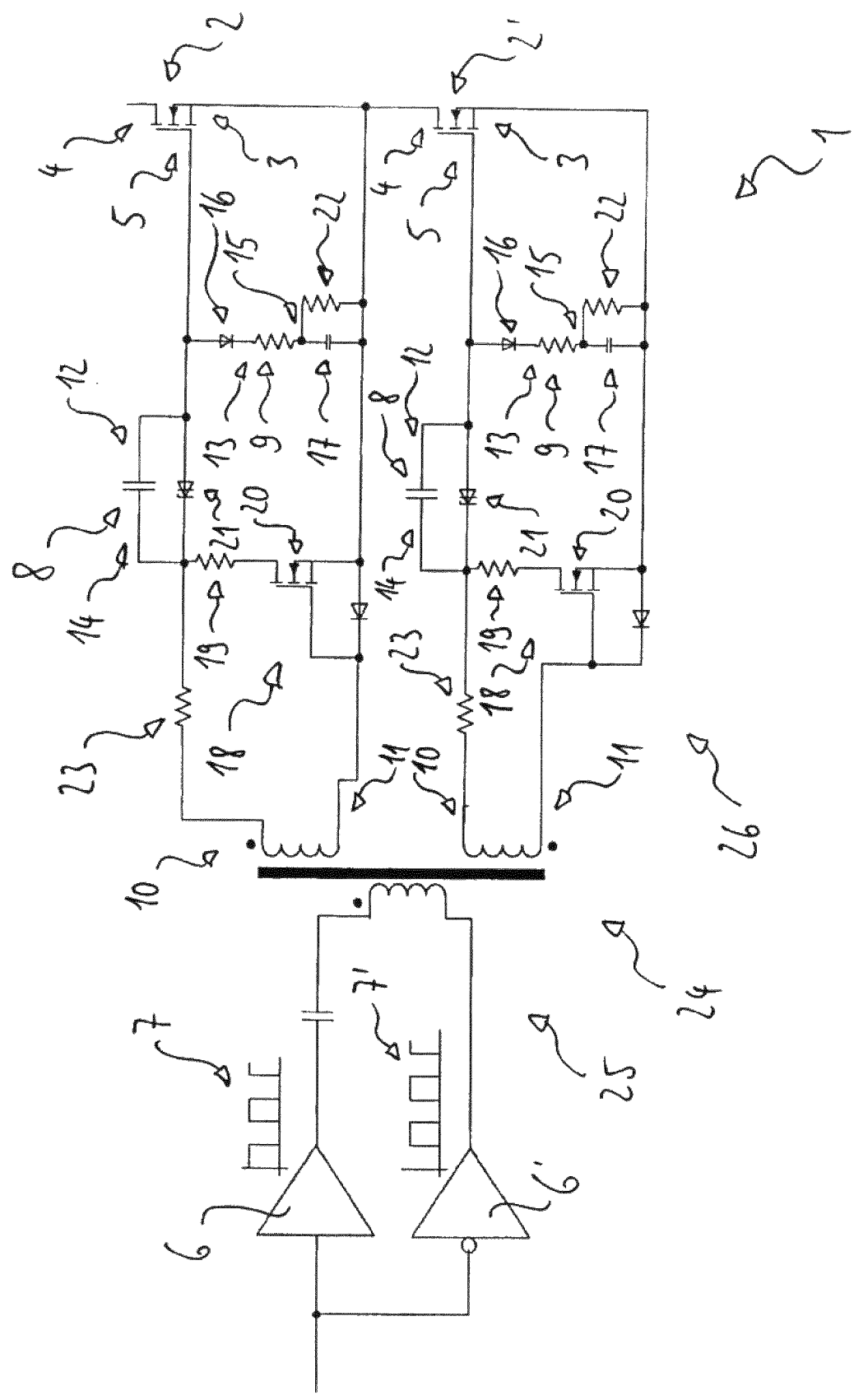
FIG. 1A shows a block circuit diagram of a circuit arrangement in accordance with a first embodiment of the application.

Embodiments of the invention provide a circuit arrangement for actuating a first voltage-controlled semiconductor switching element and a bridge circuit and a power converter comprising such a circuit arrangement, which make it possible to reduce the duration for the provision of a matched switch-off voltage.

Some embodiments provide a circuit arrangement for actuating a first voltage-controlled semiconductor switching element comprising a first electrode, a second electrode and a control electrode having a pulse generator, which is designed to generate an in particular unipolar control voltage input signal for actuating the first semiconductor switching element, wherein the control voltage input signals contain a switch-on voltage signal for switching on the first semiconductor switching element and a switch-off voltage signal for switching off the first semiconductor switching element. In addition, the circuit arrangement has a bias capacitor, whereas the bias capacitor is electrically connected or coupled to the pulse generator in such a way that an amplitude of a switch-off voltage signal which can be applied to the control electrode is variable by means of the bias capacitor. Furthermore, the circuit arrangement has a first electrical resistor. The first electrical resistor and the bias capacitor are connected electrically in series in an electrical path between a first connection of the pulse generator and a second connection of the pulse generator. The control electrode is electrically connected to a first connection of the bias capacitor and to a first connection of the first electrical resistor. In addition, the first electrode is electrically connected to a second connection of the pulse generator and to a second connection of the first electrical resistor. The circuit arrangement furthermore has a further capacitor, which is connected electrically in series with the first electrical resistor and the bias capacitor in the line path between the first connection of the pulse generator and the second connection of the pulse generator.

In this case, a first connection of the pulse generator and a second connection of the pulse generator are understood here and below to mean that the first connection and the second connection are electrically connected or coupled to the pulse generator and therefore are electrically and operatively connected to the pulse generator without necessarily being connected to the pulse generator via a line path, however. In addition, the first electrical resistor will be understood here and below to mean a passive electrical component and not the physical quantity.

The circuit arrangement in accordance with the mentioned embodiment enables a reduction in the duration for the provision of a varied or matched switch-off voltage. In this case, the amplitude of the switch-off voltage signal which can be applied to the control electrode can be varied by means of a superposition of the control voltage input signals with a charging voltage of the bias capacitor. The charging of the bias capacitor takes place when the circuit arrangement is switched on or when the component containing the circuit arrangement is switched on stepwise by virtue of the energy with which the control electrode is charged. This operation typically lasts a few milliseconds, during which the first semiconductor switching element can be switched off more slowly than a subsequent continuous operating mode. By means of the embodiment shown, acceleration of the provision of the matched switch-off voltage is advantageously made possible. This takes place in particular by virtue of the provision of the first electrical resistor. In this case, it is assumed that the charging of the bias capacitor is dependent on the energy which is output by the circuit arrangement to the control electrode of the first semiconductor switching element during each switch-on operation. Thus, the charging of the bias capacitor can be accelerated by virtue of the fact that an additional load is connected to the output of the circuit arrangement. In the embodiment shown, this takes place by means of the first electrical resistor, which is arranged between the control electrode and the first electrode of the first semiconductor switching element. The costs for the entire circuit arrangement are in this case not significantly increased in an advantageous manner.

In the abovementioned embodiment, the first electrical resistor and the bias capacitor are therefore arranged electrically in parallel with one another in a line path between the first electrode and the control electrode.

In one embodiment of the circuit arrangement, the amplitude of the switch-off voltage signal which can be applied to the control electrode is variable by means of the bias capacitor in such a way that the switch-off voltage signal has a polarity which is opposite that of a switch-on voltage signal. As a result, a susceptibility to faults of the first semiconductor switching element can be reduced.

In one embodiment, the circuit arrangement furthermore has a first diode, wherein the first diode is connected electrically in series with the first electrical resistor and the bias capacitor in the electrical path between the first connection of the pulse generator and the second connection of the pulse generator. In this case, the first diode may be selected from the group consisting of a Schottky diode and a bipolar diode. Furthermore, the first electrical resistor and the first diode can be integrated monolithically in the circuit arrangement.

In a further embodiment, the bias capacitor has a first capacitance $C_1$, and the capacitor has a third capacitance $C_3$, wherein the first capacitance $C_1$ substantially corresponds to the third capacitance $C_3$. Preferably, the following applies in this case: $C_1 = C_3$.

By means of the mentioned embodiments, the further switching response of the circuit arrangement, i.e. the switching response apart from the accelerated provision of the matched switched-off voltage, is changed as little as possible. In particular, it is now possible for the additional load in the form of the first electrical resistor not to subject the circuit arrangement to loading, as far as possible, after a transient phenomenon. This takes place by means of the provision of the capacitor and the first diode, which are connected in series with the first electrical resistor. The first electrical resistor loads the circuit arrangement thereby only as long as the capacitor is still not charged.

The first semiconductor switching element can in particular be in the form of a MOSFET. In this configuration, the first electrode forms a source electrode, the second electrode forms a drain electrode and the control electrode forms a gate electrode of the MOSFET. In particular, the first semiconductor switching element can be in the form of a normally off n-channel MOSFET. The varied switch-off voltage signal in this configuration has a negative polarity, and the switch-on voltage signal has a positive polarity.

Furthermore, the first semiconductor switching element can be in the form of an IGBT. In this case, the first electrode forms an emitter electrode, the second electrode forms a collector electrode, and the control electrode forms a gate electrode of the IGBT.

In a further embodiment, the circuit arrangement furthermore has a discharge circuit, which is designed to discharge the control electrode. The discharge circuit is in this case connected electrically in parallel with the bias capacitor, when viewed from the pulse generator, and has a second electrical resistor and a second semiconductor switching element. The second semiconductor switching element can in particular be in the form of a MOSFET or in the form of a bipolar transistor.

In a further embodiment, the circuit arrangement furthermore has a second diode, wherein the second diode is connected electrically in parallel with the bias capacitor. In this embodiment, the first electrical resistor is connected electrically in series with the parallel circuit comprising the second diode and the bias capacitor in the electrical path between the first connection of the pulse generator and the second connection of the pulse generator. A maximum charging voltage for the bias capacitor can be set by means of the second diode. The second diode may be in the form of a Zener diode for this purpose.

In one embodiment, the first electrical resistor has a resistance of 100 ohms. It is thus possible to ensure that the first electrical resistor does not short-circuit the circuit arrangement even during a transient phenomenon.

Other embodiments provide a bridge circuit, which has a circuit arrangement in accordance with one of the mentioned embodiments. In particular, the bridge circuit can be in the form of a half-bridge circuit.

Other embodiments provide a power converter, in particular a DC-to-DC converter, which has a circuit arrangement in accordance with one of the mentioned embodiments.

The bridge circuit and the power converter in accordance with the application have the advantages which have already been mentioned in connection with the circuit arrangement according to the application and which will not be set forth again at this juncture so as to avoid repetition.

FIG. 1A shows a block circuit diagram of a circuit arrangement 1 for actuating voltage-controlled semiconductor switching elements 2 and 2'.

In the embodiment shown, the semiconductor switching elements 2 and 2' are in the form of normally off n-channel MOSFETs and each have a first electrode 3 in the form of a source electrode, a second electrode 4 in the form of a drain electrode, and a control electrode 5 in the form of a gate electrode. The circuit arrangement 1 therefore forms a gate driver circuit in the embodiment shown, and the first electrode 3 forms a reference electrode for the control electrode 5. The semiconductor switching elements 2 and 2' are part of a half-bridge circuit, wherein the semiconductor switching elements 2 form a so-called high-side switch, and the semiconductor switching elements 2' form a so-called low-side switch of the half-bridge circuit.

The circuit arrangement 1 has a first pulse generator and a second pulse generator. In this case, the first pulse generator comprises a first amplifier 6 and a transformer 24 having a primary side 25 and a secondary side 26, wherein the first amplifier 6 is electrically connected to the primary side 25 of the transformer 24. Similarly, the second pulse generator comprises a second amplifier 6' and a transformer 24 having a primary side 25 and a secondary side 26, wherein the second amplifier 6 is electrically connected to the primary side 25 of the transformer 24. Thus, the first and second pulse generators have a common transformer 24. For its part, the transformer 24 has a common input coil on the primary side 25, which common input coil is connected between the first and second amplifiers 6, 6'. On the secondary side 26, the transformer 24 has in each case one output coil, each having a first electrical connection 10 and a second electrical connection 11. In this case, the first pulse generator is designed to generate unipolar control voltage input signals 7, and the second pulse generator is designed to generate unipolar control voltage input signals 7'. The control voltage input signals 7 and 7' each have a switch-on voltage signal for switching on the semiconductor switching element 2 and 2', respectively, and a switch-off voltage signal for switching off the semiconductor switching element 2 and 2', respectively, wherein the control voltage input signals 7 and 7' are phase-shifted through 180° with respect to one another in relation to the pulse/no-pulse ratio. By means of the switch-off voltage signal which can be applied to the respective control electrode 5 it is effected that no electrically conductive channel is formed in the semiconductor switching element 2 or 2', whereas, by means of the switch-on voltage signal, a control voltage is applied to the control electrode 5, in which an electrically conductive channel is formed. Further details in respect of the actuation of the semiconductor switching elements 2 and 2' will be explained in more detail below.

On the secondary side 26 of the transformer 24, the circuit arrangement 1 has in each case one bias capacitor 8 for the semiconductor switching elements 2 and 2'. The bias capacitors 8 are in this case electrically connected to the respective pulse generator via the respective first connection 10 and the respective second connection 11 in such a way that an amplitude of a switch-off voltage signal which can be applied to the control electrode 5 of the corresponding semiconductor switching element 2 or 2' is variable by means of the respective bias capacitor 8. In this case, the amplitude is variable in such a way that a negative switch-off voltage signal can be provided which therefore has the opposite polarity to that of a positive switch-on voltage signal.

In addition, the circuit arrangement 1 has, on the secondary side of the transformer 24, in each case one first electrical resistor 9 for the semiconductor switching elements 2 and 2'. In addition, in the embodiment shown, the circuit arrangement 1 has in each case one second diode 21 for the semiconductor switching elements 2 and 2', wherein the second diode 21 is connected electrically in parallel with the respective bias capacitor 8. Therefore, in the embodiment shown, the first electrical resistor 9 is connected electrically in series with the parallel circuit comprising the second diode 21 and the bias capacitor 8 in an electrical path between the first connection 10 and the second connection 11 of the corresponding pulse generator. The second diode 21 is in the form of a Zener diode, for example. Therefore, the maximum charging voltage of the bias capacitor 8 can be set by means of the second diode 21. The control electrode 5 of the respective semiconductor switching element 2 or 2' is electrically connected to a first connection 12 of the corresponding bias capacitor 8 and to a first connection 13 of the corresponding first electrical resistor 9. Furthermore, the first electrode 3 of the respective semiconductor switching element 2 or 2' is electrically connected to a second connection 14 of the corresponding bias capacitor 8 and to a second connection 15 of the corresponding first electrical resistor 9. Therefore, the first electrical resistor 9 and the parallel circuit comprising the second diode 21 and the bias capacitor 8 are arranged electrically in parallel with one another in a line path between the first electrode 3 and the control electrode 5 and are electrically connected to the first electrode 3 and the control electrode 5.

In the embodiment shown, the circuit arrangement 1 furthermore has a first diode 16 and a capacitor 17, wherein the first diode 16 and the capacitor 17 are connected electrically in series with the first electrical resistor 9 and the parallel circuit comprising the second diode 21 and the bias capacitor 8 in the electrical path between the first connection 10 and the second connection 11 of the corresponding pulse generator. The first diode 16 is, for example, selected from the group consisting of a Schottky diode and a bipolar diode, and the bias capacitor 8 typically has a first capacitance $C_1$, which substantially corresponds to a third capacitance $C_3$ of the capacitor 17. In particular, the relationship $C_1=C_3$ can apply.

In the embodiment shown, the first connection 12 of the bias capacitor 8 is electrically connected to the first diode 16, and the first diode 16 is furthermore electrically connected to the first connection 13 of the first electrical resistor 9. The second connection 15 of the first electrical resistor 9 is in addition electrically connected to the capacitor 17.

The control voltage input signals 7 and 7' for actuating the semiconductor switching elements 2 and 2', respectively, are transmitted to the semiconductor switching elements 2 and 2' by means of the transformer 24. The discharge of the respective gate electrode takes place on the secondary side 26 of the transformer by means of a discharge circuit 18, wherein the discharge circuit 18 is connected electrically in parallel with the series circuit comprising the respective bias capacitor 8 and the respective control electrode 5 and has a second electrical resistor 19 and a second semiconductor switching element 20, wherein the second semiconductor switching element 20 forms a switch-off MOSFET in the embodiment shown.

In order to switch off the semiconductor switching elements 2 and 2' with a negative gate voltage, the charging voltage of the corresponding bias capacitor 8 is superposed on the respective gate signal. The charging of the bias capacitor 8 during switch-on in this case takes place stepwise owing to the energy with which the respective MOSFET gate is charged. By means of the embodiment shown, in this case the provision of the negative switch-off voltage can be accelerated without the other switching response of the circuit arrangement 1 being changed. Since the charging of the bias capacitors 8 is dependent on the energy which is emitted by the gate driver during each switch-on operation to the respective gate of the semiconductor switching elements 2 and 2', this can be accelerated by virtue of the fact that an additional load is connected to the output of the gate driver. This is achieved by the embodiment shown by virtue of the first electrical resistor 9 which has a relatively low resistance between the respective gate and source connections of the two MOSFETs. The first electrical resistor 9 is in this case dimensioned in such a way that it does not short-circuit the circuit arrangement 1 even during the transient condition and is typically 100 ohms.

Since after the transient condition the additional load in the form of the first electrical resistor 9 is not intended, where possible, to load the gate driver, the capacitor 17 and the first diode 16 are connected in series with the first electrical resistor 9. The first electrical resistor 9 thus loads the circuit arrangement 1 only as long as the capacitor 17 is not yet charged.

Furthermore, the circuit arrangement 1 in the embodiment shown has a second electrical resistor 22, which is connected electrically in parallel with the capacitor 17 and is used for discharging the capacitor 17. In addition, the circuit arrangement 1 has a third electrical resistor 23, which is connected electrically in series with the parallel circuit comprising the second diode 21 and the bias capacitor 8 and forms a charging resistor for the bias capacitor 8.

Figure 1B:
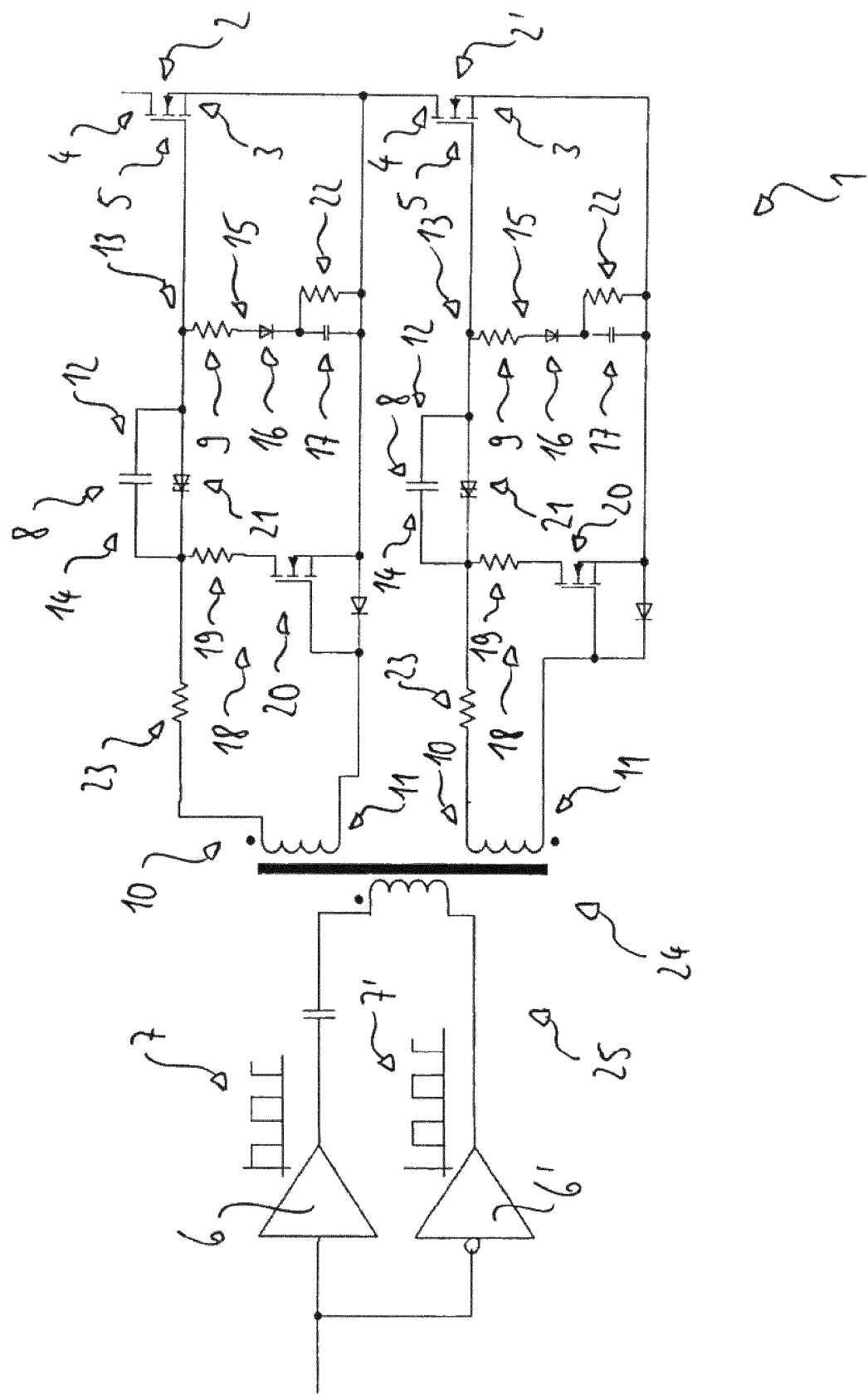
FIG. 1B shows a block circuit diagram of a circuit arrangement in accordance with a second embodiment of the application.

FIG. 1B shows a block circuit diagram of a circuit arrangement in accordance with a second embodiment of the application. Components having the same functions as in FIG. 1A are identified by the same reference symbols and will not be explained again below.

The second embodiment shown in FIG. 1B differs from the first embodiment shown in FIG. 1A to the extent that the order of the arrangement of the first electrical resistor 9 and the first diode 16 in the electrical path between the first connection 10 and the second connection 11 is swapped over, i.e. the first connection 12 of the bias capacitor 8 is electrically connected to the first connection 13 of the first electrical resistor 9, and the second connection 15 of the first electrical resistor 9 is electrically connected to the first diode 16. In addition, the first diode 16 is connected to the capacitor 17.

Furthermore, the order of the arrangement of the first electrical resistor 9, the first diode 16 and the capacitor 17 in the electrical series circuit formed by these components can be switched as desired, wherein the second electrical resistor 22 is always connected electrically in parallel with the capacitor 17.

Figure 2:
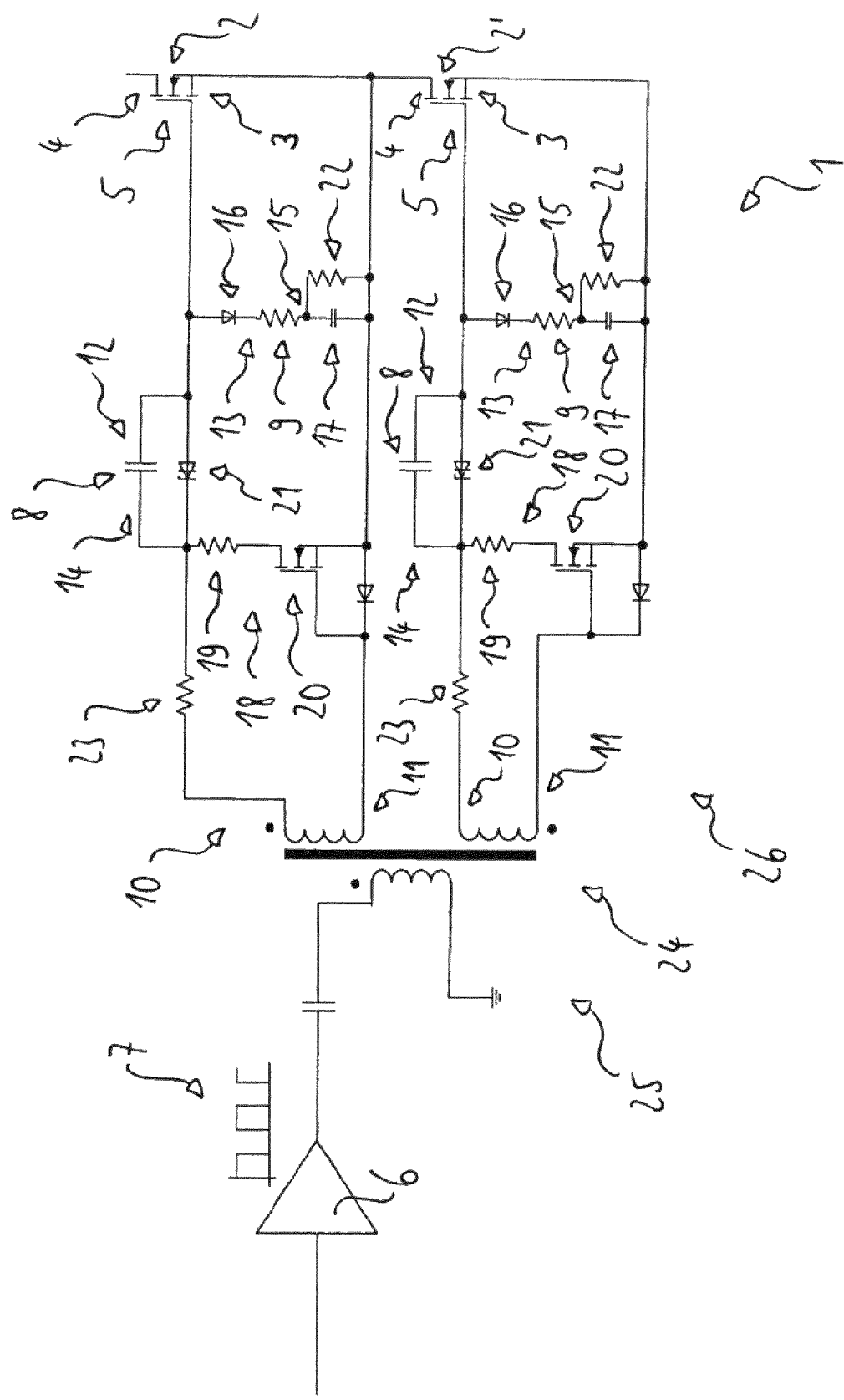
FIG. 2 shows a block circuit diagram of a circuit arrangement in accordance with a third embodiment of the application.

FIG. 2 shows a block circuit diagram of a circuit arrangement 1 in accordance with a third embodiment of the application. Components with the same functions as in the previous figures are identified by the same reference symbols and will not be explained again below.

The third embodiment shown in FIG. 2 differs from the previous embodiments in that only one pulse generator is arranged on the primary side 25 of the transformer 24, wherein again an amplifier 6 of the pulse generator is illustrated. Thus, the voltage amplitude is halved in comparison with the previous embodiments. Correspondingly, only control voltage input signals 7 for actuating the semiconductor switching elements 2 and 2' are generated by means of the pulse generator.

Figure 3A:
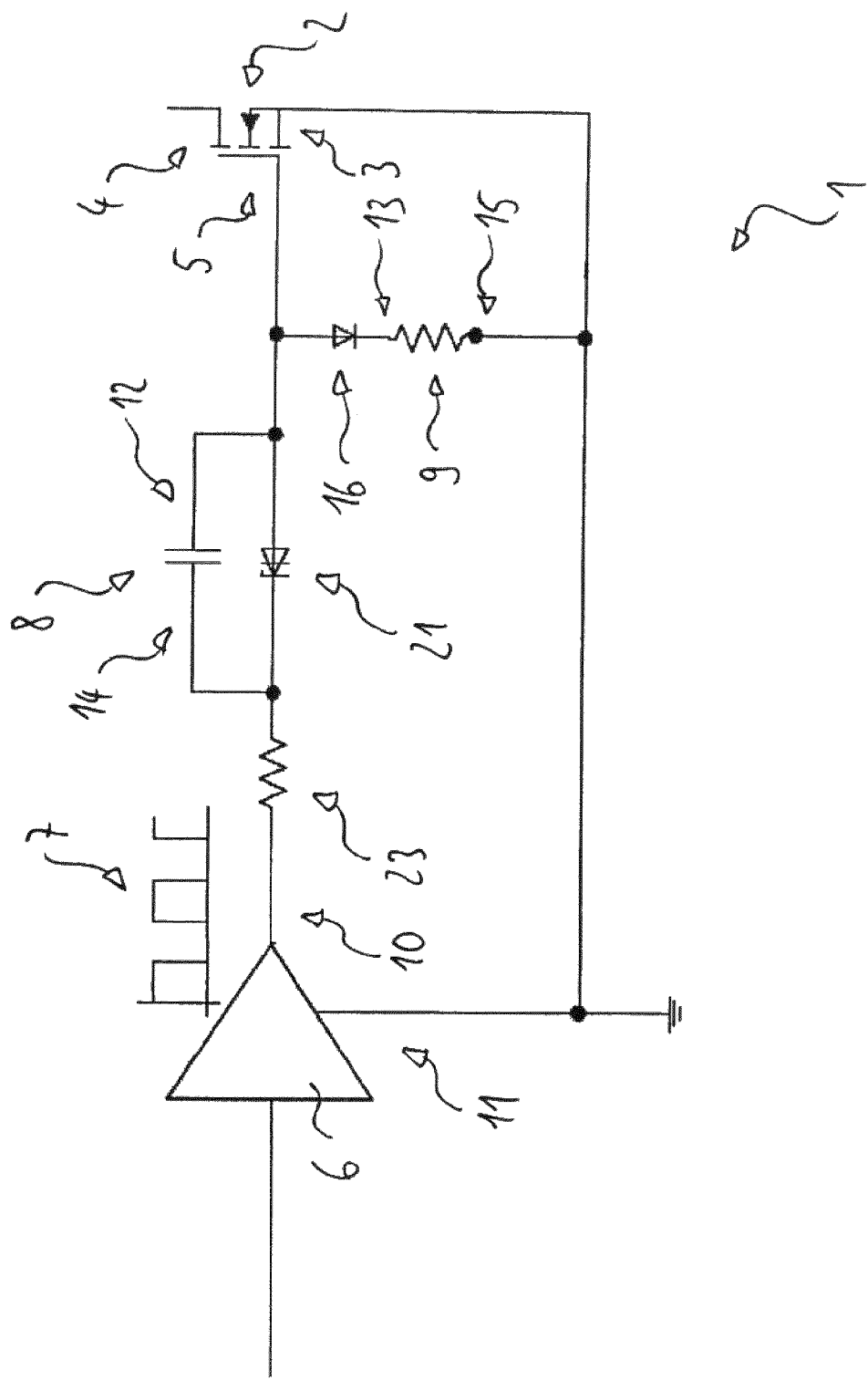
FIG. 3A shows a block circuit diagram of a circuit arrangement in accordance with a fourth embodiment of the application.

FIG. 3A shows a block circuit diagram of a circuit arrangement 1 in accordance with a fourth embodiment of the application. Components having the same functions as in the previous figures are identified by the same reference symbols and will not be explained again below. The embodiment shown in FIG. 3A differs from the previous embodiments in that the circuit arrangement 1 has only one semiconductor switching element 2 in the form of a normally off n-channel MOSFET. In addition, the embodiment shown does not have a transformer. The pulse generator is therefore not galvanically isolated from the further components.

Furthermore, the embodiment shown in FIG. 3A does not contain any further capacitor in addition to the bias capacitor 8 and does not contain a second electrical resistor arranged in parallel with said further capacitor or a discharge circuit in accordance with the previous embodiments.

Figure 3B:
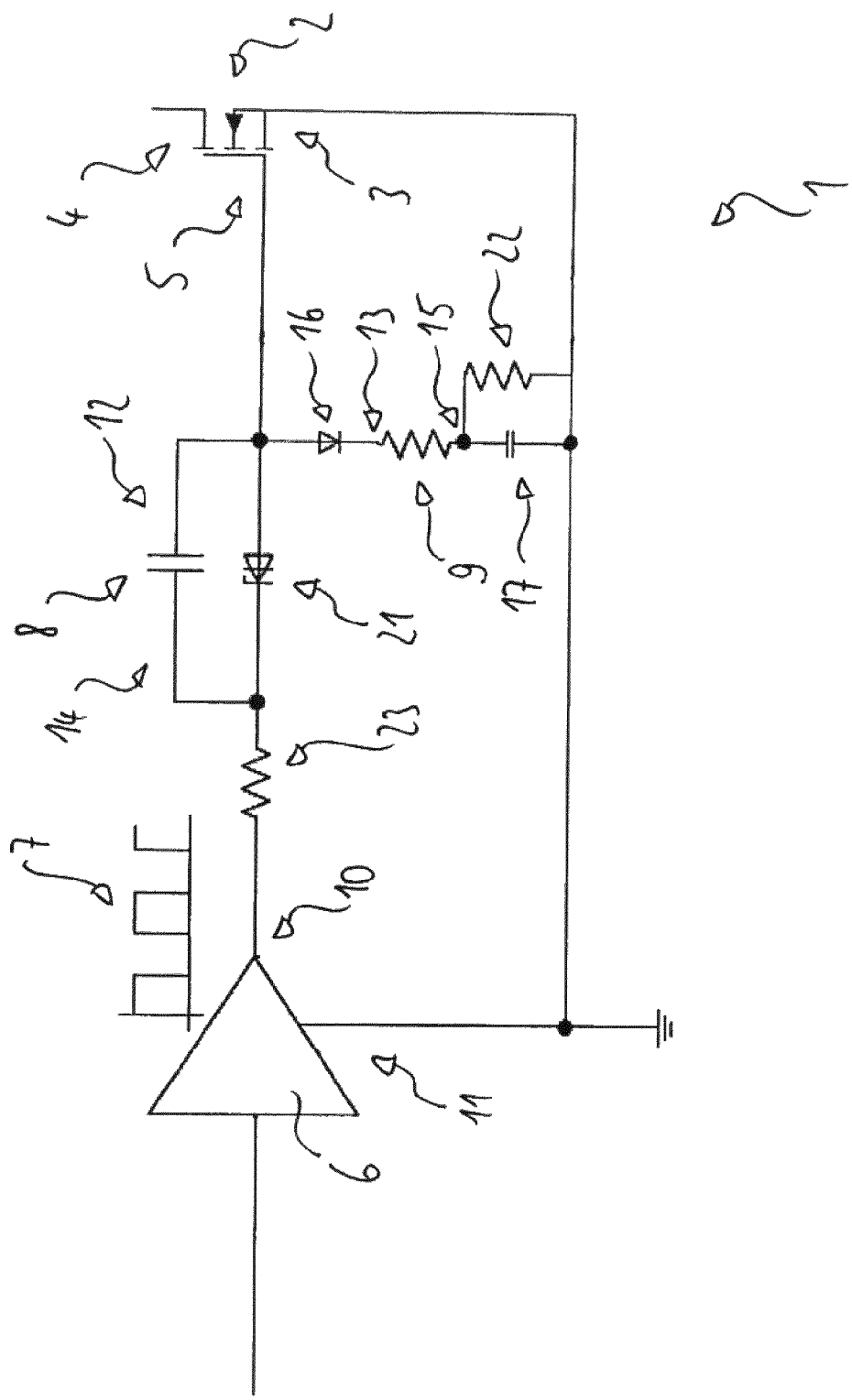
FIG. 3B shows a block circuit diagram of a circuit arrangement in accordance with a fifth embodiment of the application.

FIG. 3B shows a block circuit diagram of a circuit arrangement in accordance with a fifth embodiment of the application. Components having the same functions as in the previous figures are identified by the same reference symbols and will not be explained again below.

The embodiment shown in FIG. 3B differs from the embodiment shown in FIG. 3A in that the circuit arrangement 1 has a capacitor 17 in addition to the bias capacitor 8, wherein the capacitor 17 is connected electrically in series with the first electrical resistor 9 and the parallel circuit comprising the second diode 21 and the bias capacitor 8 in the line path between the first connection 10 of the pulse generator and the second connection 11 of the pulse generator. In addition, the circuit arrangement 1 has a second electrical resistor 22, which is connected electrically in parallel with the capacitor 17.

Figure 4:
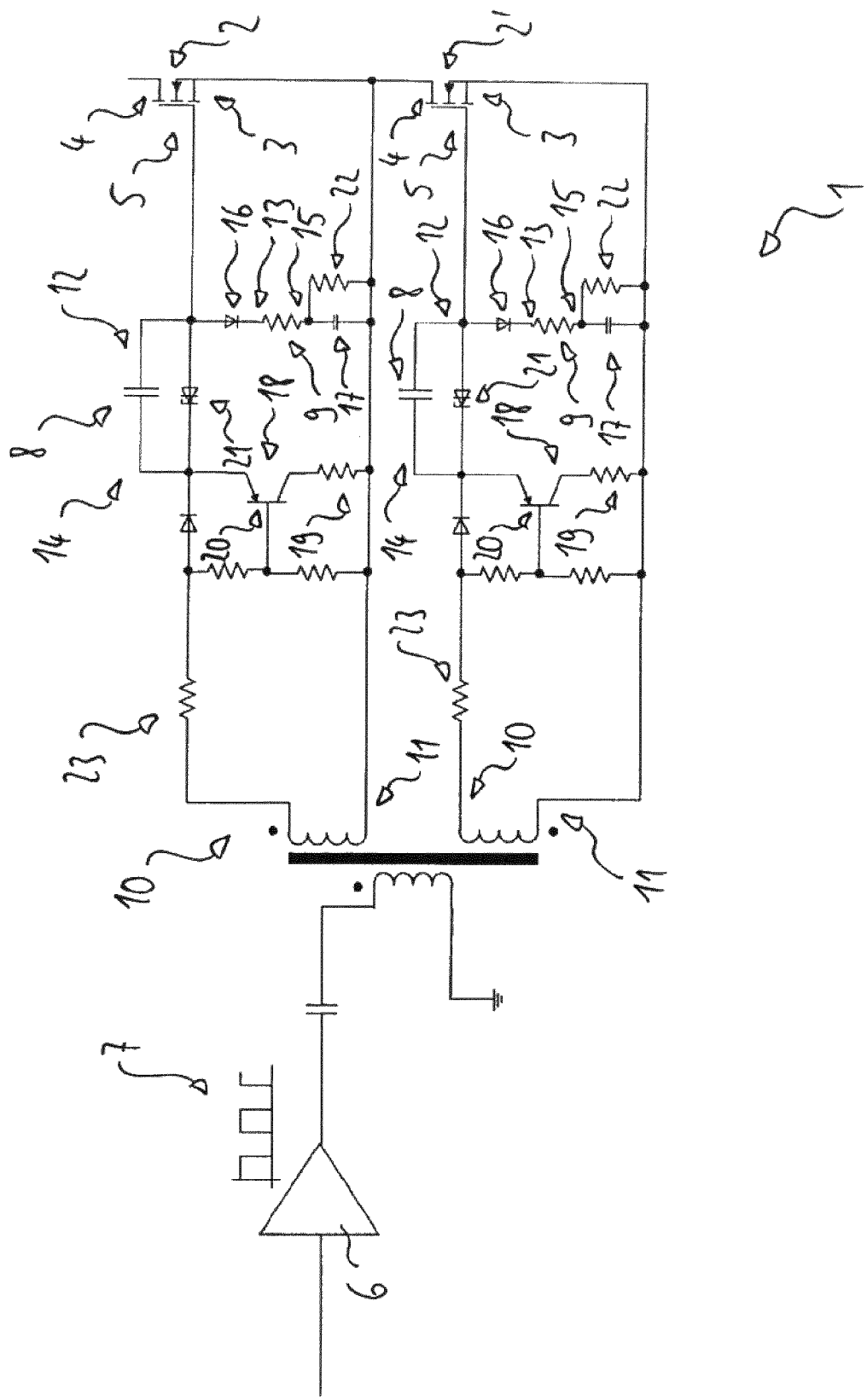
FIG. 4 shows a block circuit diagram of a circuit arrangement in accordance with a sixth embodiment of the application.

FIG. 4 shows a block circuit diagram of a circuit arrangement 1 in accordance with a sixth embodiment of the application. Components with the same functions as in the previous figures are identified by the same reference symbols and will not be explained again below.

The embodiment shown in FIG. 4 differs from the embodiment shown in FIG. 2 in that the discharge circuit 18 has a second semiconductor switching element 20 in the form of a bipolar transistor.

The embodiments of the circuit arrangement 1 shown in FIGS. 1A to 4 merely represent exemplary gate driver circuits. The acceleration circuit in accordance with the application can in this case be used in any gate driver which has a bias capacitor 8 which is charged by the gate energy.

Such gate drivers are used, for example, in DC-to-DC converters of the medium power class, i.e. from several hundred watts to several kilowatts. In particular, the circuit arrangement 1 can be used for DC-to-DC converters which are used in solar installations.

Figure 5A:
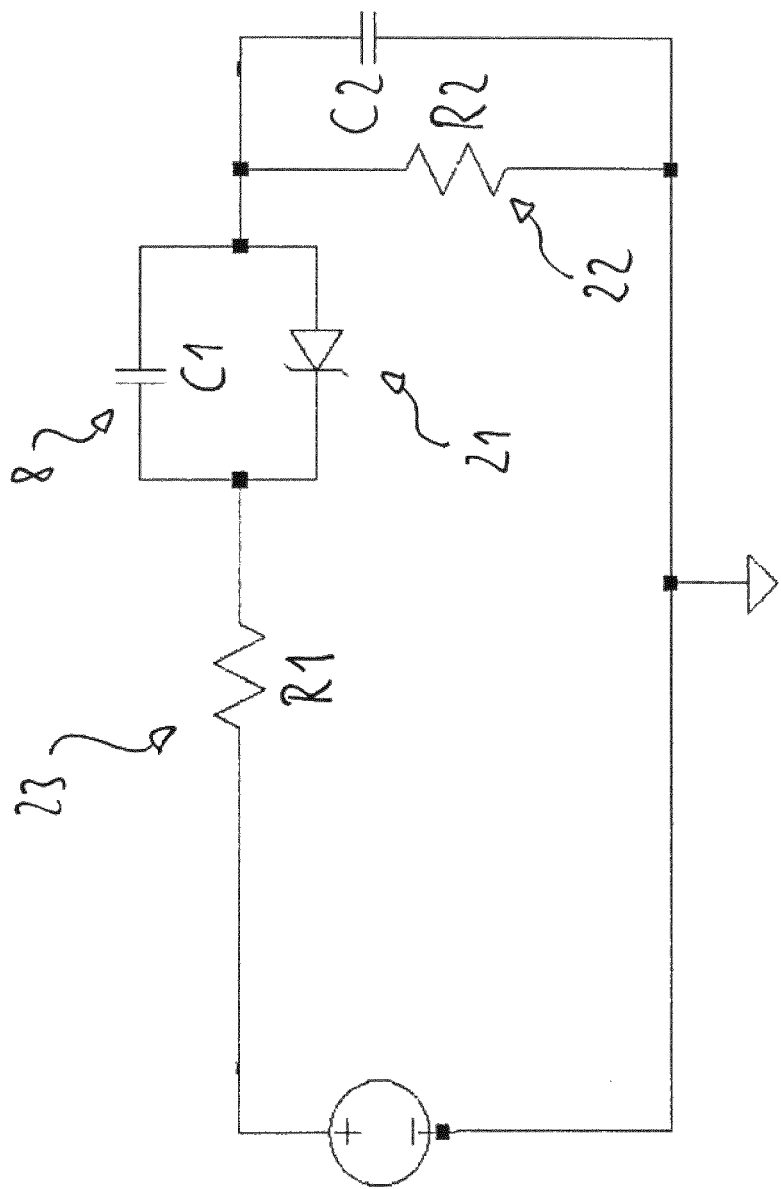
FIG. 5A shows a schematic block circuit diagram of a circuit arrangement for simulation purposes.
Figure 5B:
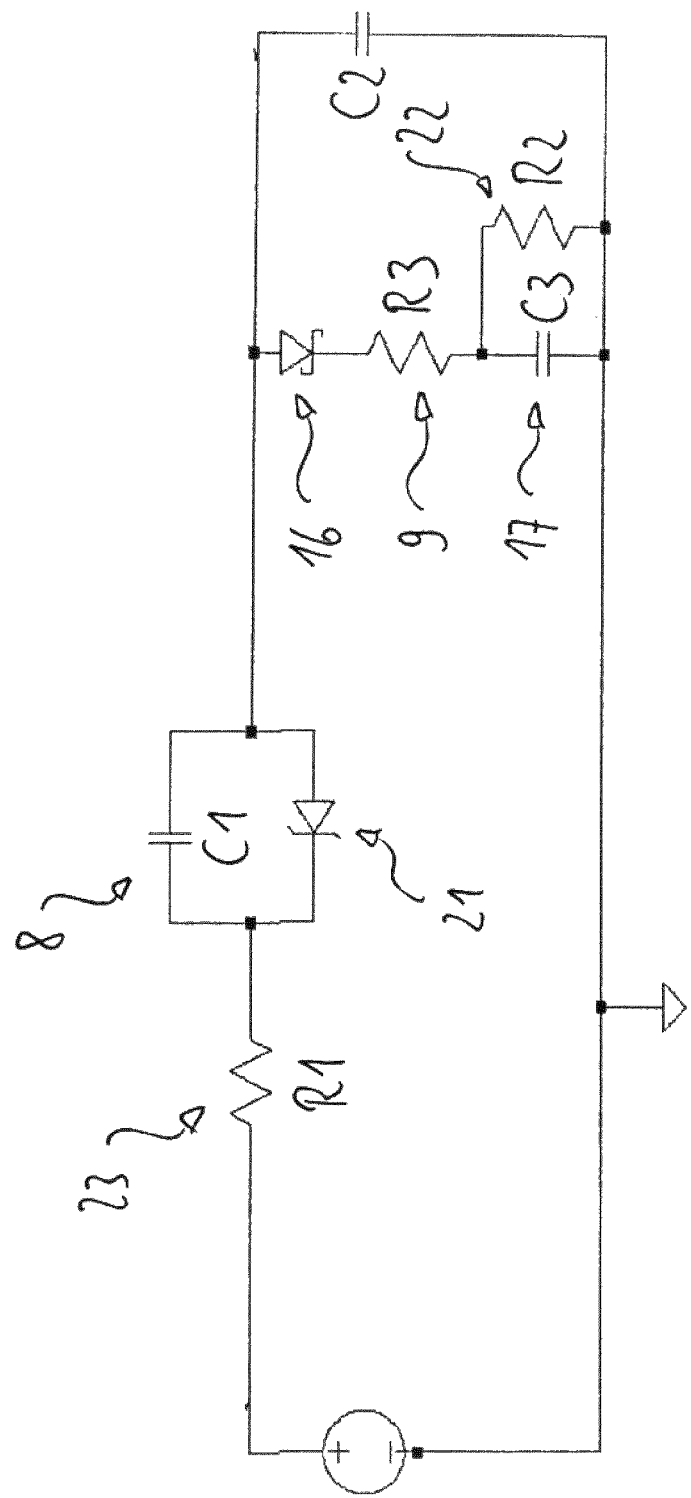
FIG. 5B shows a schematic block circuit diagram of a circuit arrangement for simulation purposes.
Figure 6B:
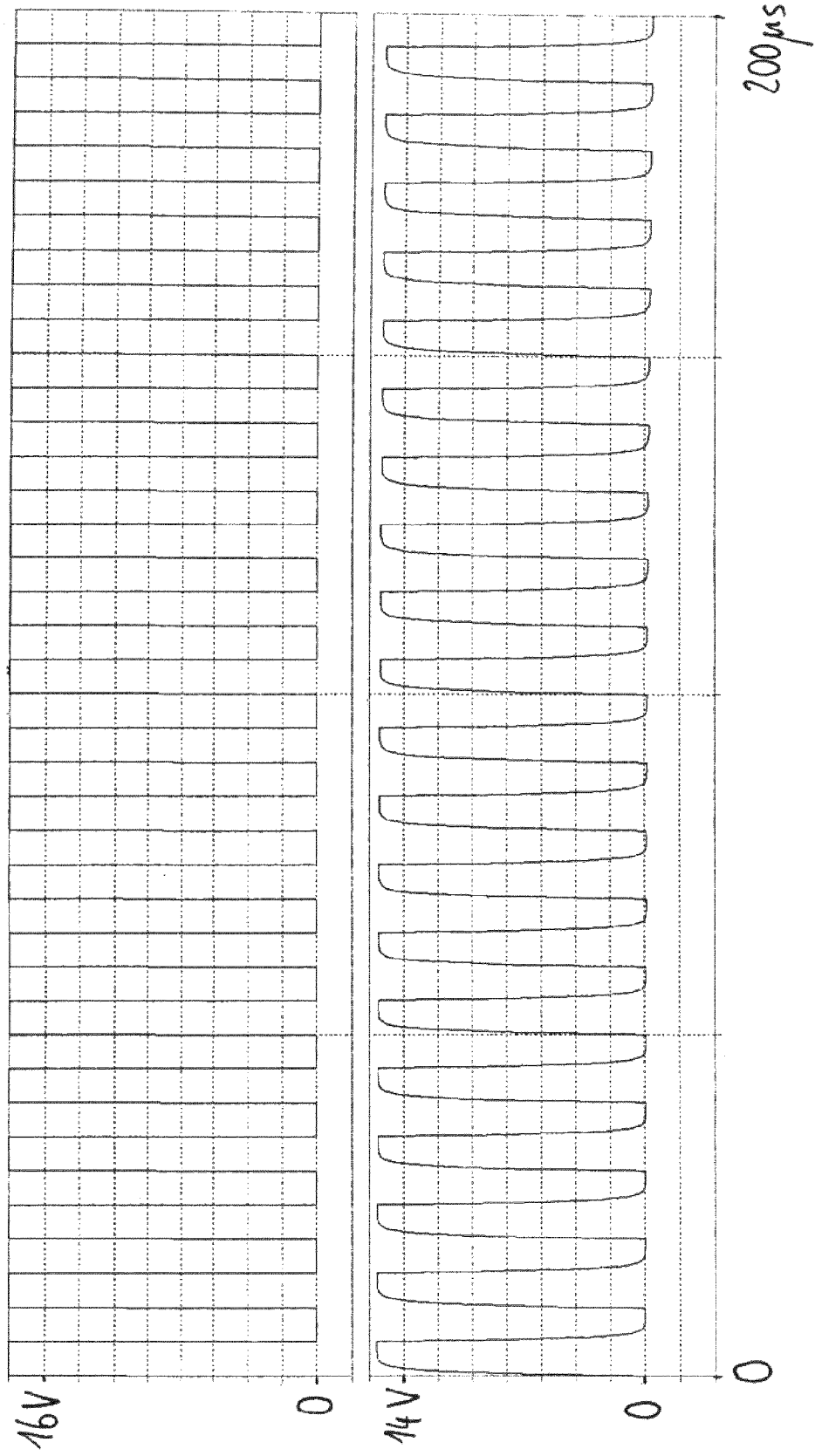

FIG. 5A shows a schematic block circuit diagram of a circuit arrangement which forms the basis for the simulations shown in FIGS. 6A and 6B, and FIG. 5B shows a schematic block circuit diagram of a circuit arrangement which forms the basis for the simulations shown in FIGS. 7A to 11B. Components with the same functions as in the previous figures are identified by the same reference symbols and will not be explained again below.

FIG. 5A in this case shows a schematic block circuit diagram of a circuit arrangement which does not have an acceleration circuit in accordance with the application, whereas FIG. 5B shows a circuit arrangement in accordance with the application.

The pulse generator is illustrated merely schematically as voltage source in FIGS. 5A and 5B. Furthermore, the semiconductor switching element in the form of a MOSFET to be actuated is not illustrated in any more detail in FIGS. 5A and 5B.

The pulse generator generates unipolar square-wave control voltage input signals, which are between zero volts and 18 V, wherein the rising and falling edges each have a rise and fall time, respectively, of 100 ns. The pulse duration is 4.9 μs and the period is 10 μs, i.e. the interval between the pulses is 4.9 μs, taking into consideration the rise and fall times.

The values for the components of the circuit arrangement shown in FIGS. 5A and 5B for the respective set of parameters on which the simulation is based are listed in table 1, wherein C2 is the input capacitance of the semiconductor switching element in the form of a MOSFET and therefore does not represent a dedicated component.

TABLE 1

| Set of parameters | C1 (nF) | C2 (nF) | C3 (nF) | R1 (Ω) | R2 (Ω) | R3 (Ω) |
|---|---|---|---|---|---|---|
| 1 | 330 | 50 | — | 10 | 10000 | — |
| 2 | 330 | 50 | 330 | 10 | 10000 | 100 |
| 3 | 330 | 50 | 330 | 10 | 10000 | 470 |
| 4 | 330 | 50 | 330 | 10 | 10000 | 33 |
| 5 | 330 | 50 | 1000 | 10 | 10000 | 100 |
| 6 | 330 | 50 | 68 | 10 | 10000 | 100 |

FIGS. 6A and 6B show voltage-time graphs for the first set of parameters. In this case, FIG. 6A shows an overview of the characteristic of the voltage over time in a time interval of 2 ms, and FIG. 6B shows a detail view of a time interval of 200 μs, wherein the control voltage input signals generated by the pulse generator are illustrated in the respective upper voltage-time graph, and the voltage applied to the control electrode in the form of the gate electrode is illustrated in the respective lower voltage-time graph.

Figure 7A:
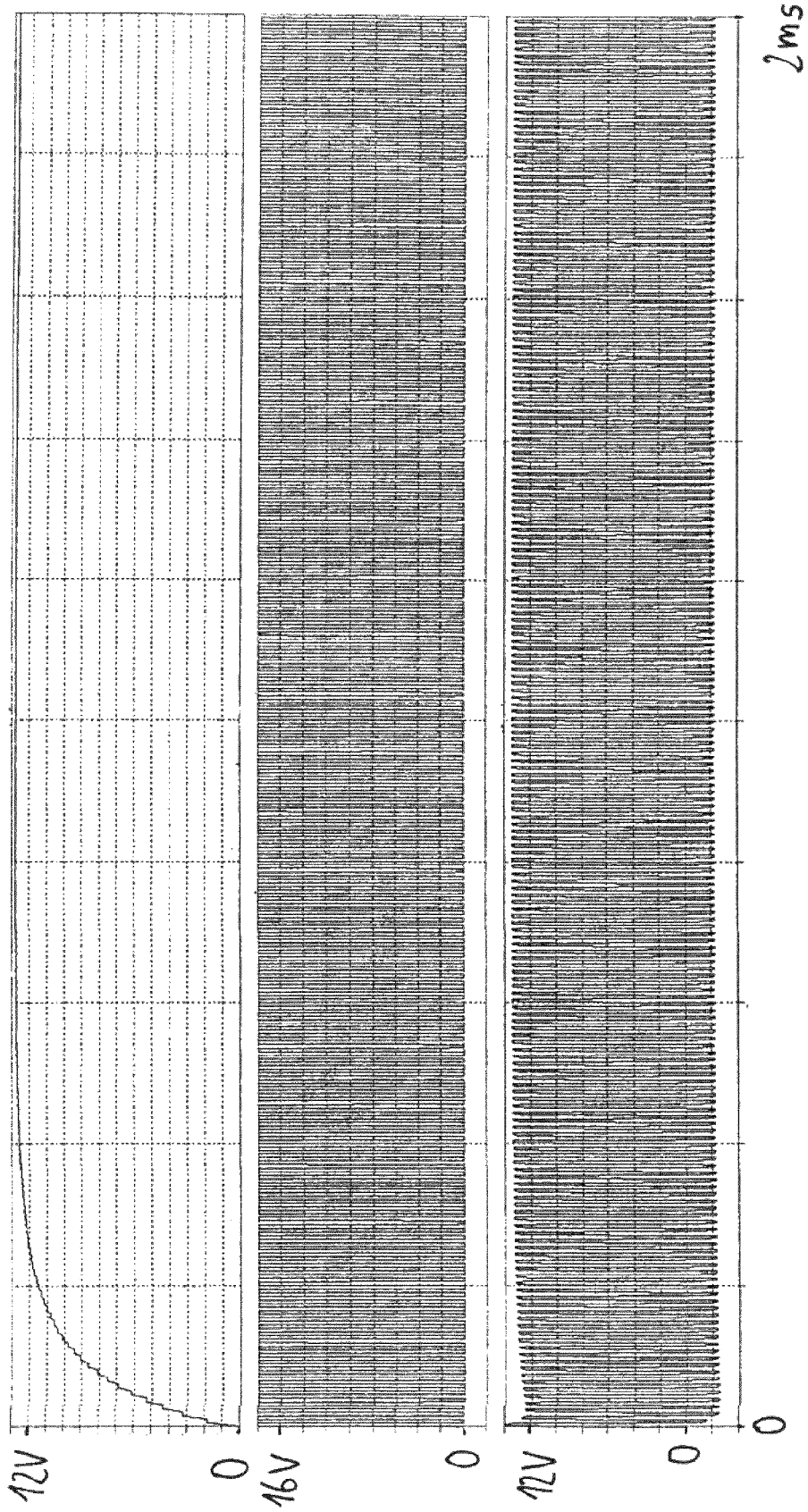
FIGS. 7A and 7B show voltage-time graphs for a second set of parameters.
Figure 7B:
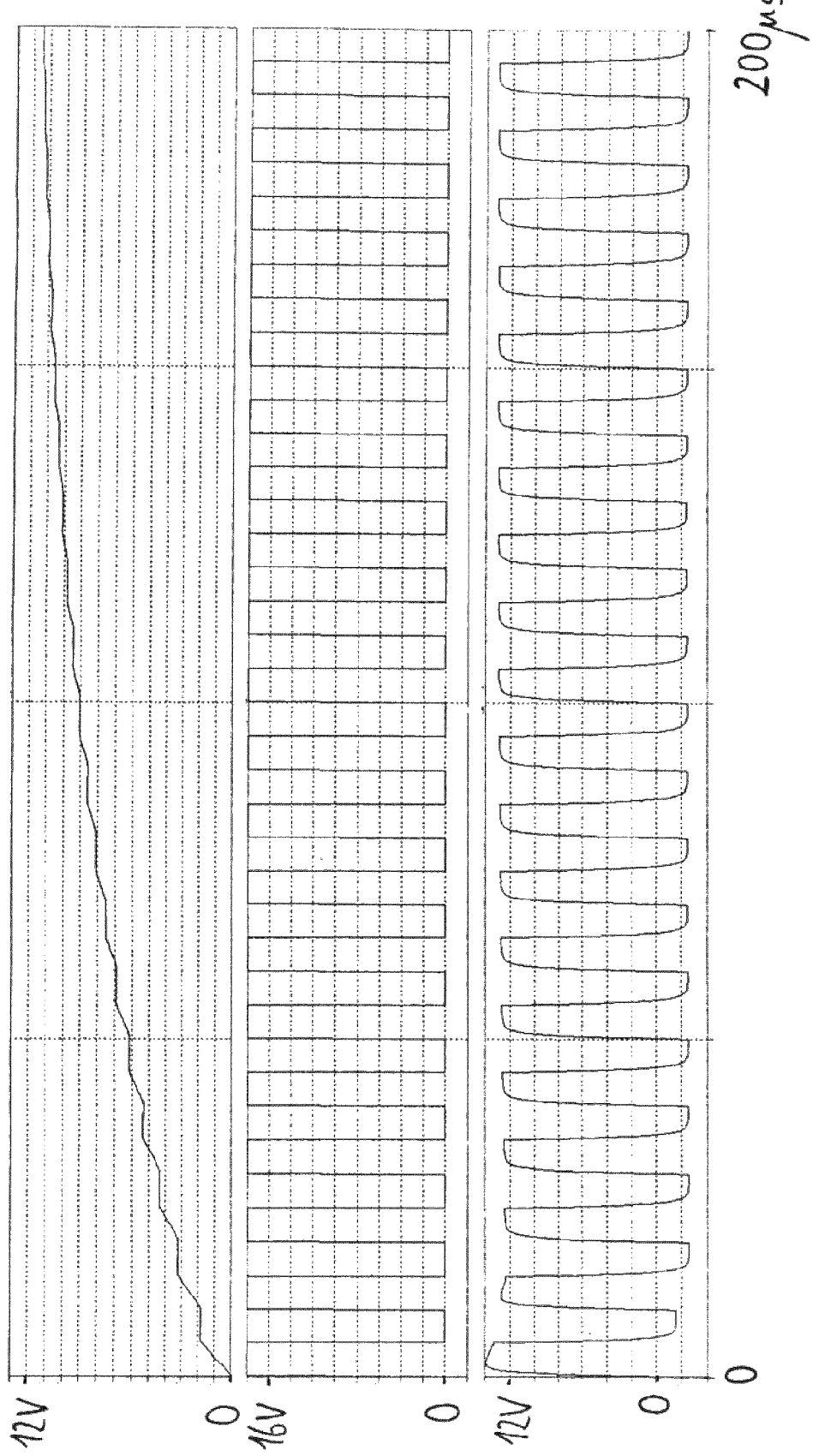
Figure 8A:
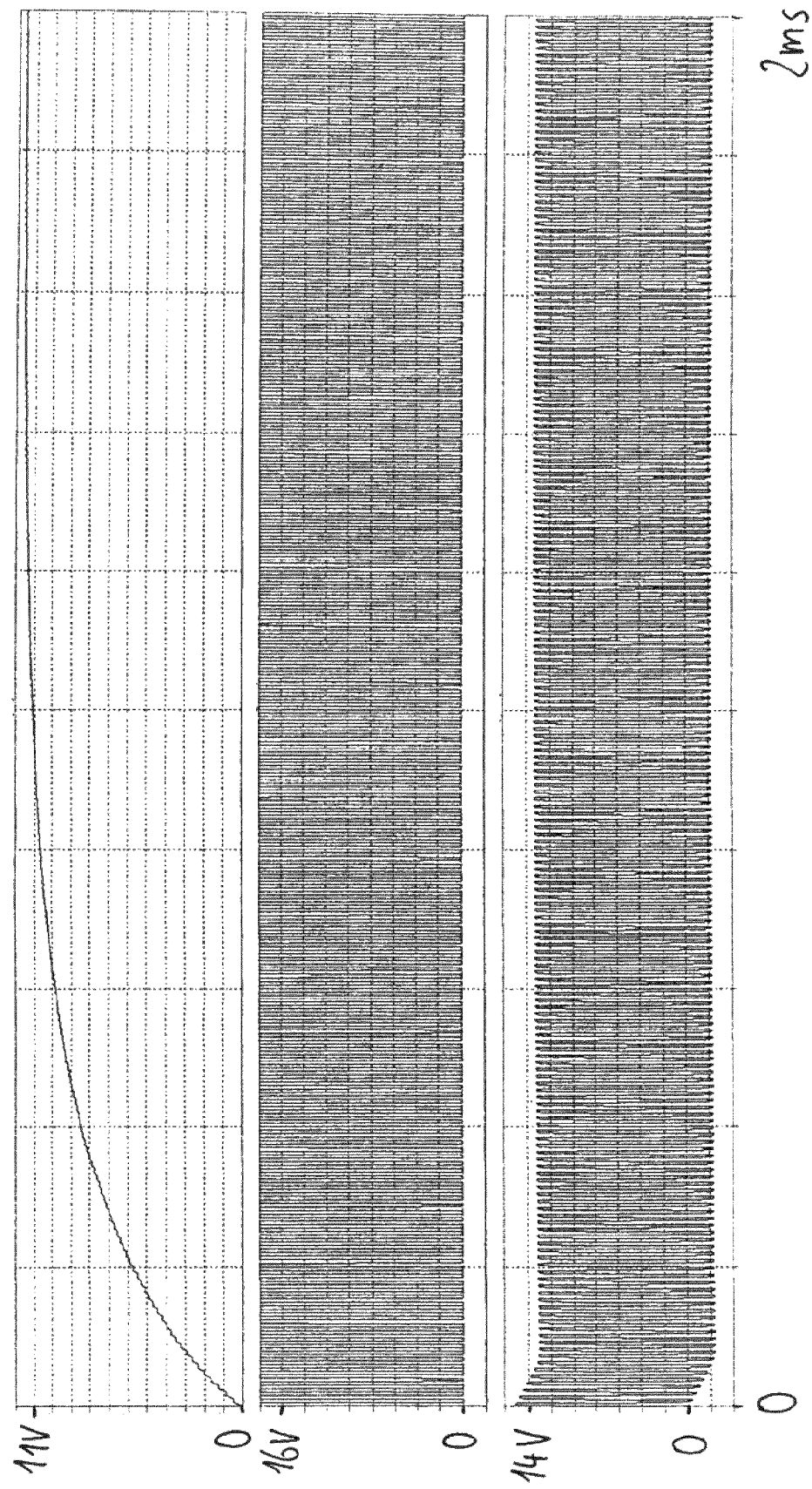
FIGS. 8A and 8B show voltage-time graphs for a third set of parameters.
Figure 8B:
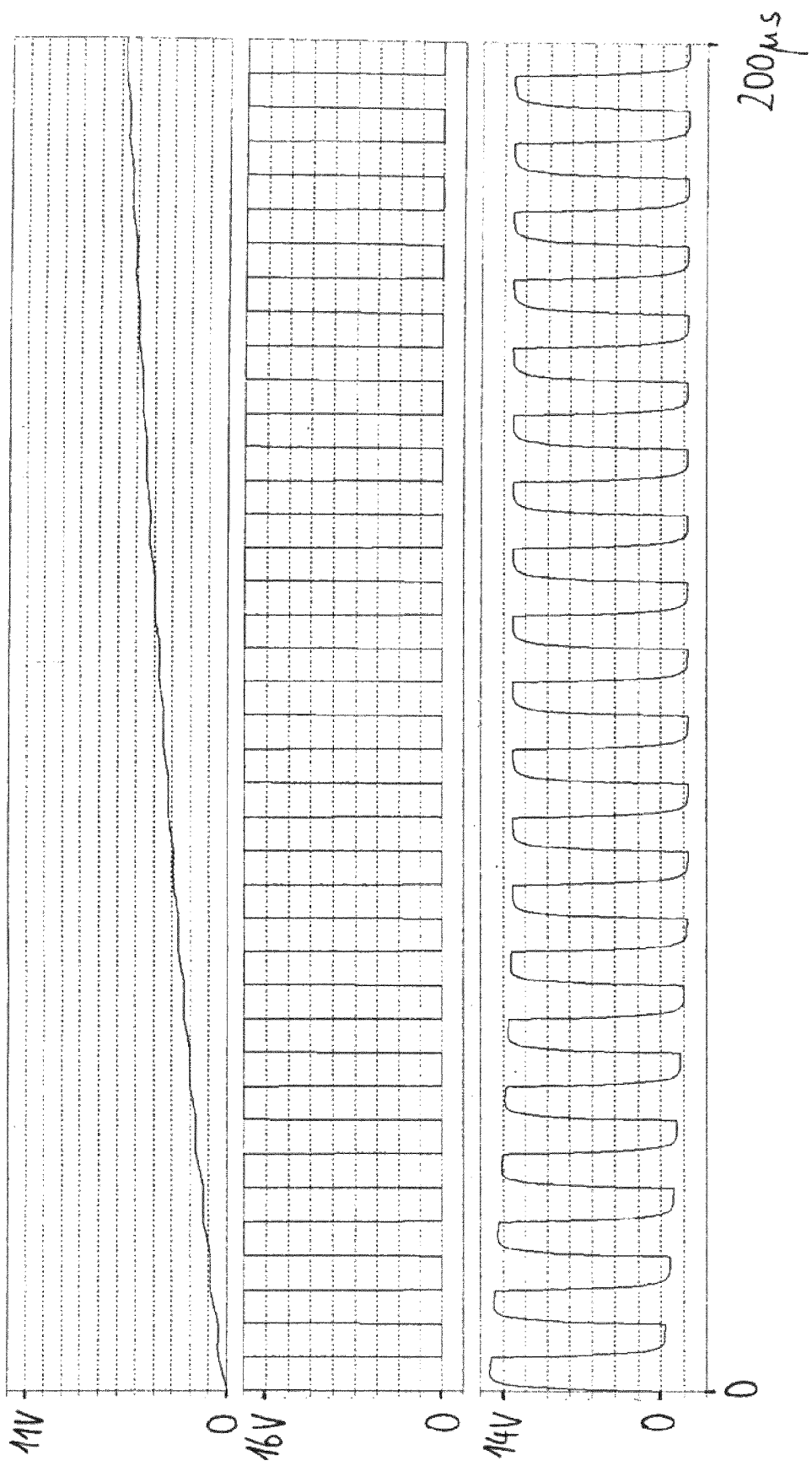
Figure 9A:
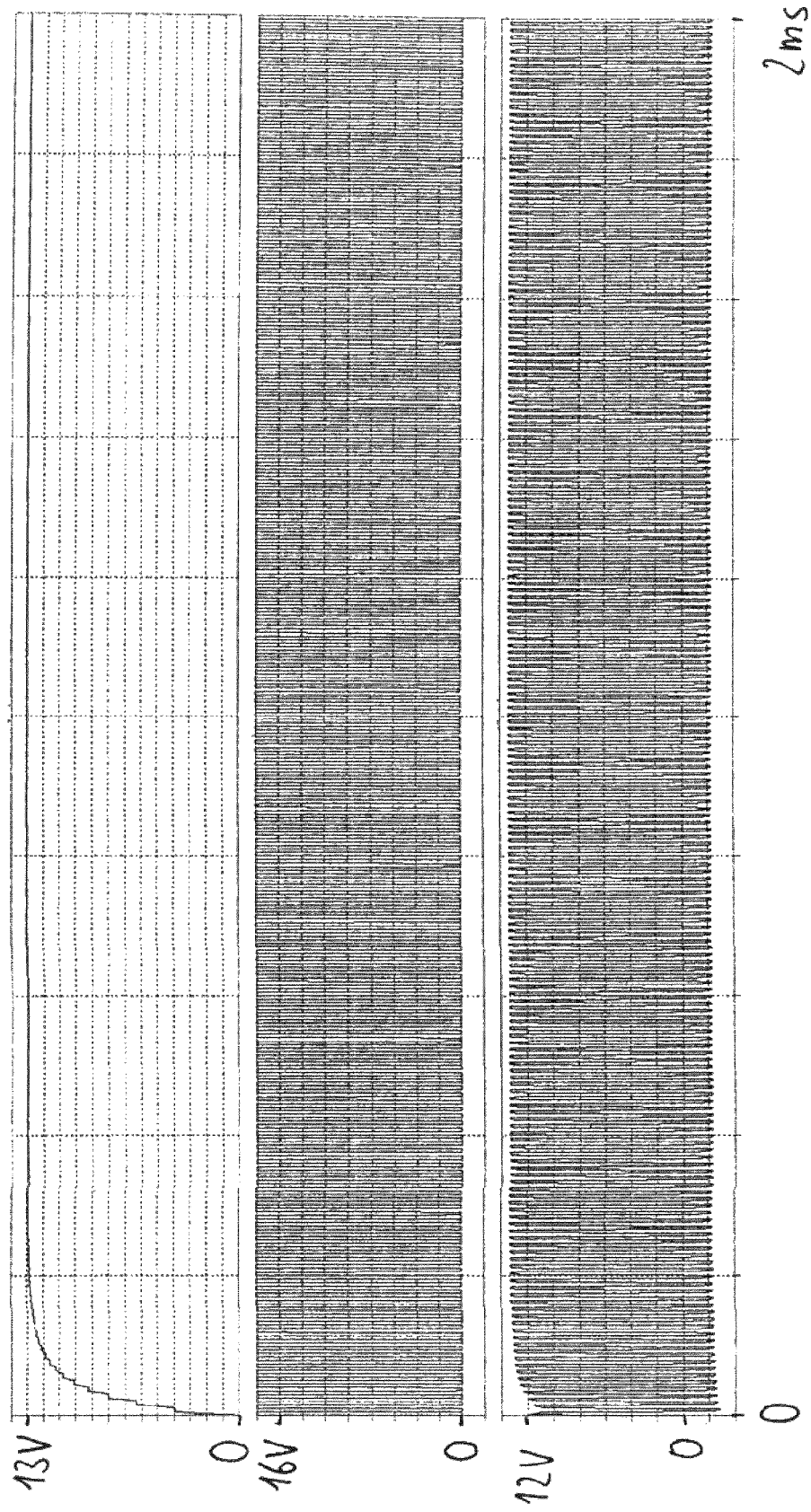
FIGS. 9A and 9B show voltage-time graphs for a fourth set of parameters.
Figure 9B:
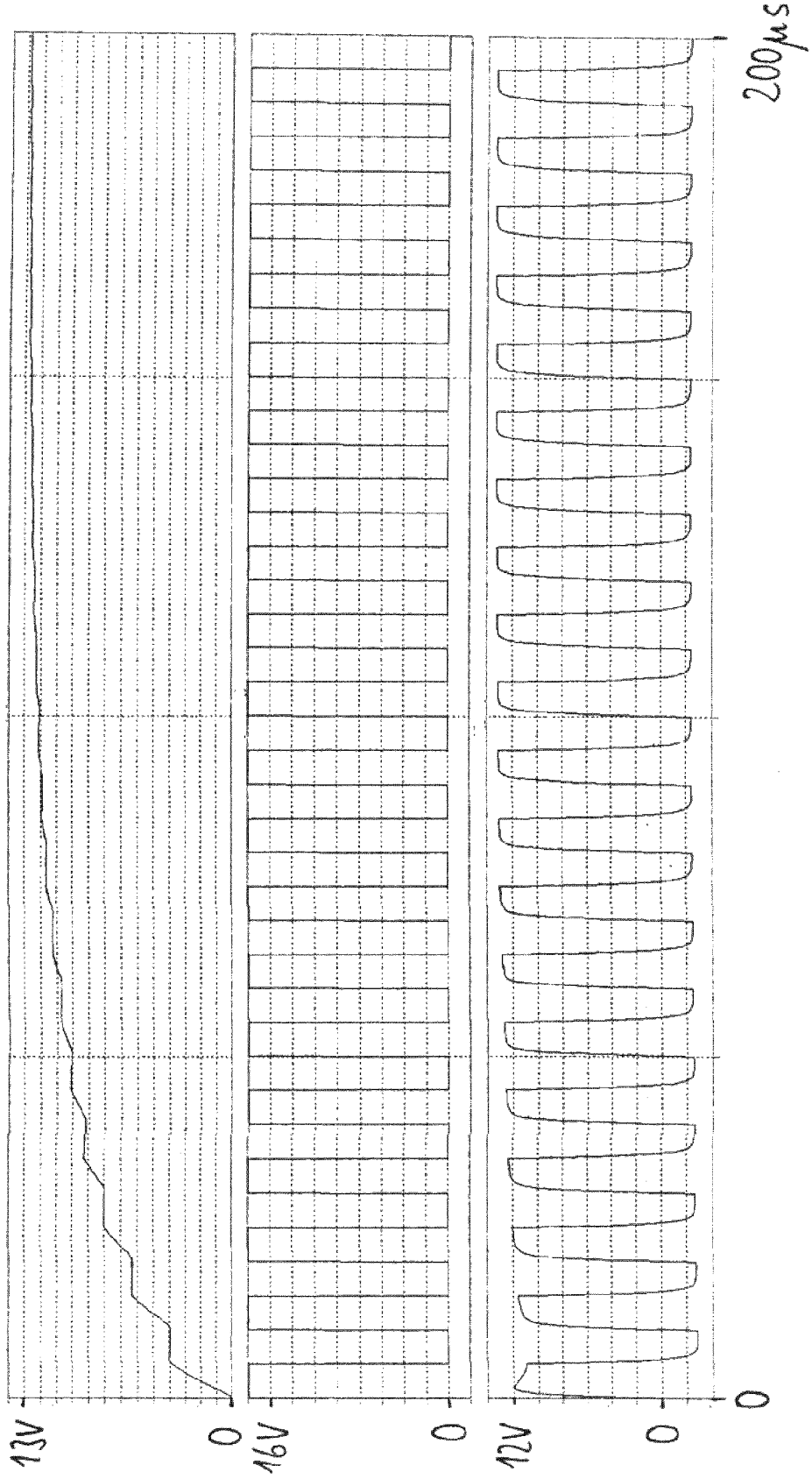
Figure 10A:
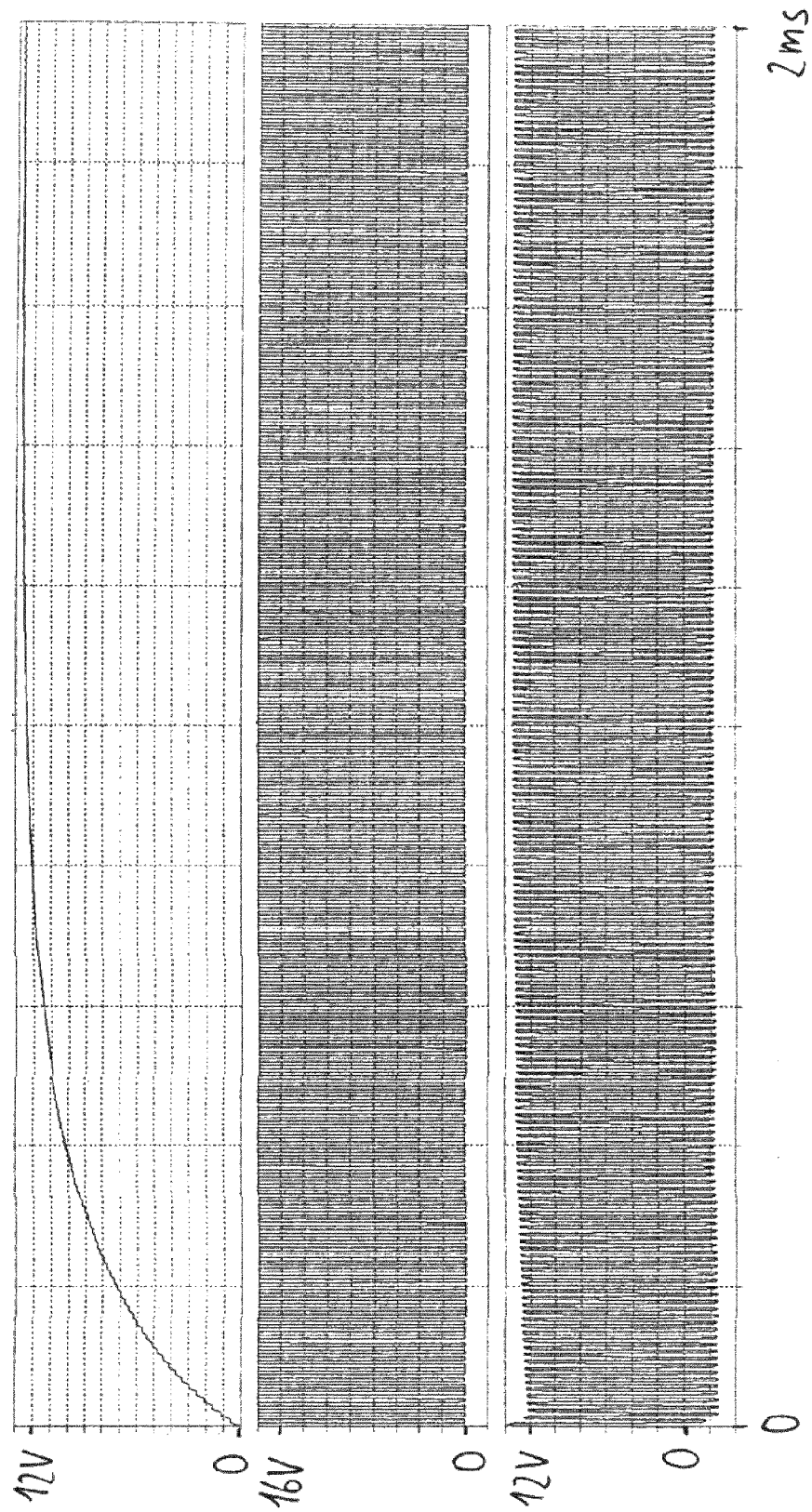
FIGS. 10A and 10B show voltage-time graphs for a fifth set of parameters.
Figure 10B:
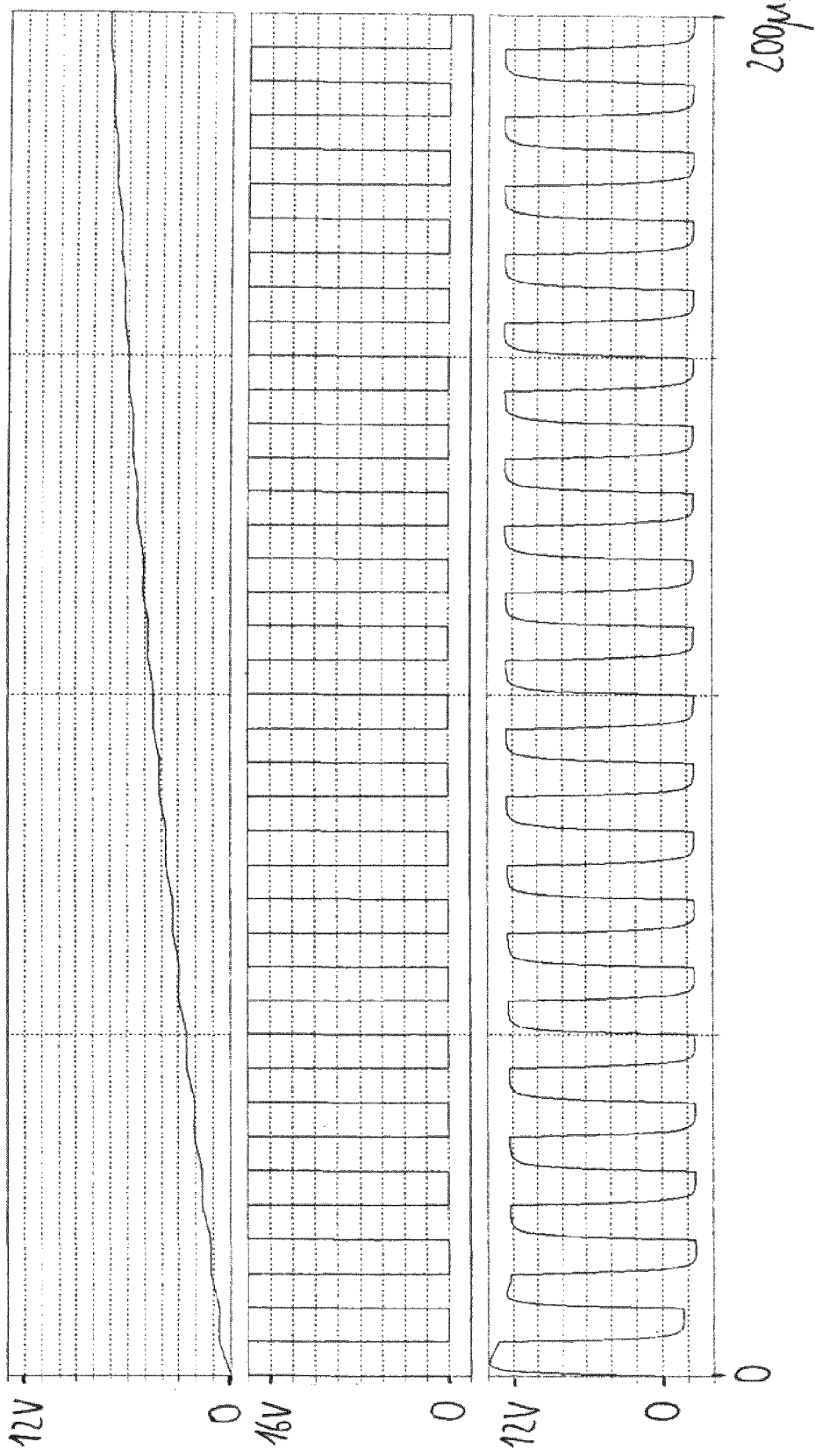
Figure 11A:
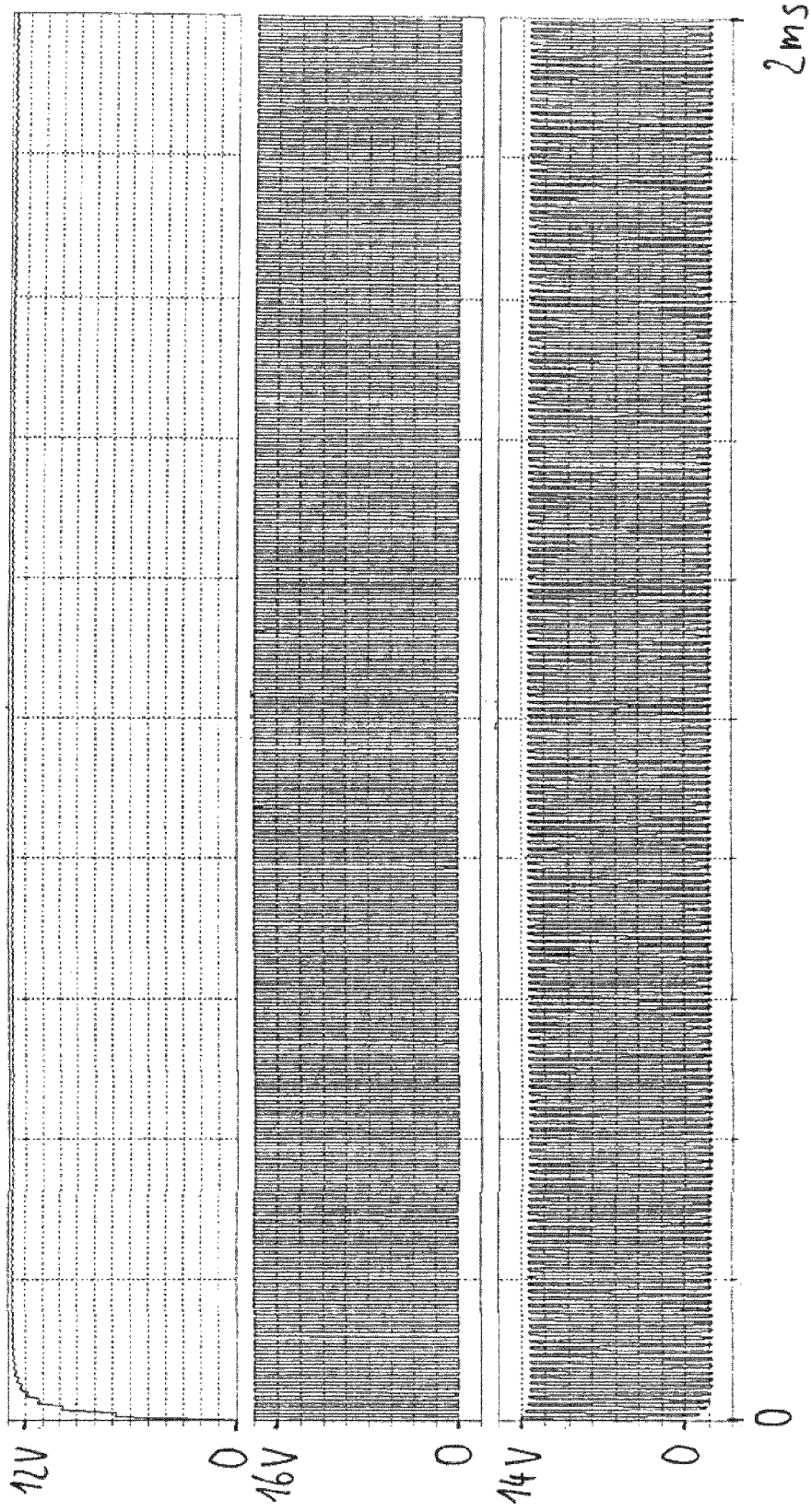
FIGS. 11A and 11B show voltage-time graphs for a sixth set of parameters.
Figure 11B:
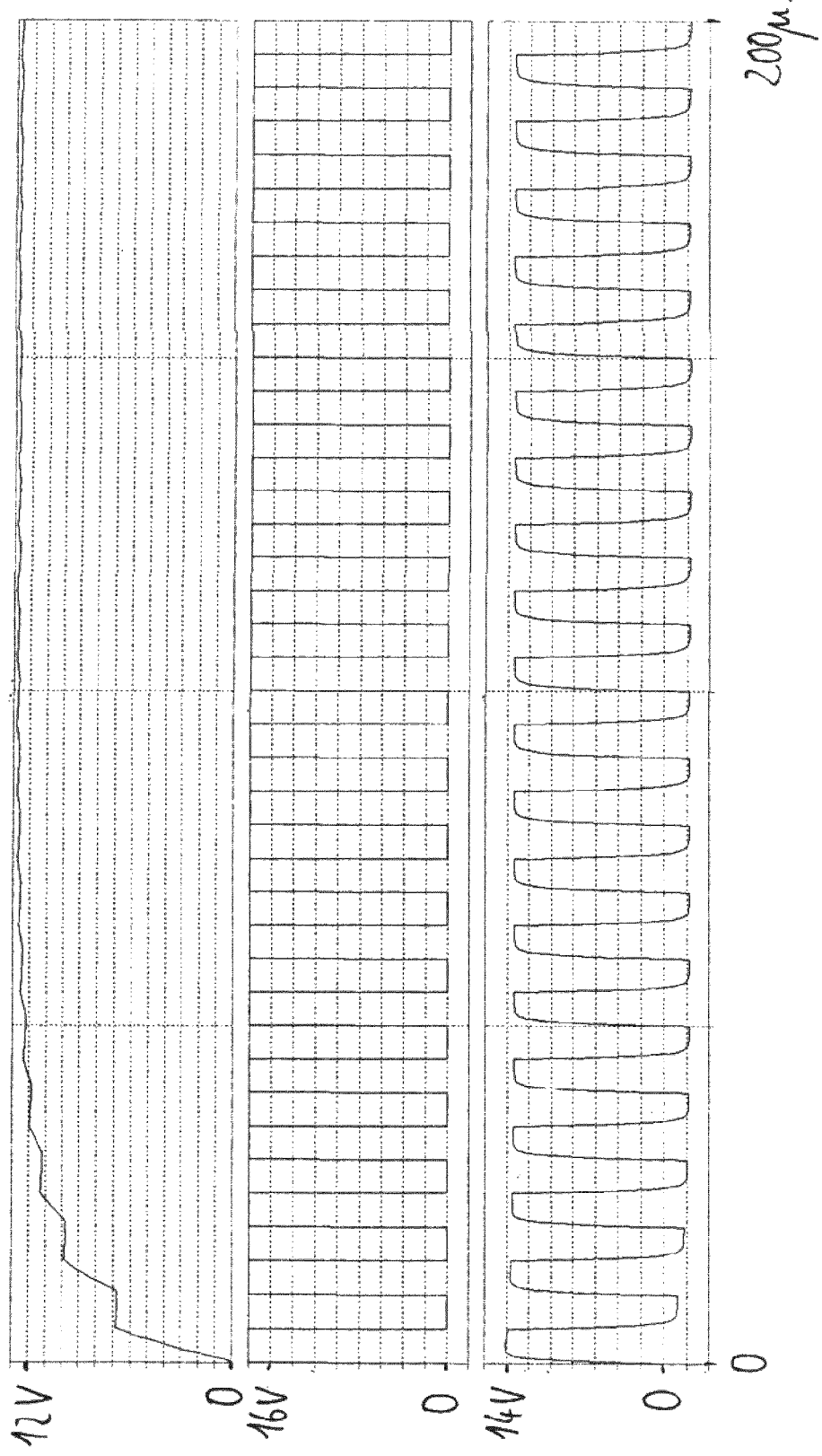

FIGS. 7A and 7B show voltage-time graphs for the second set of parameters, which in this case contains optimally selected parameters. In this case, FIG. 7A shows an overview of the characteristic of the voltage over time in a time interval of 2 ms, and FIG. 7B shows a detail view of a time interval of 200 μs, wherein the voltage of the capacitor is illustrated in the respective upper voltage-time graph, the control voltage input signals generated by the pulse generator are illustrated in the respective central voltage-time graph, and the voltage applied to the control electrode in the form of the gate electrode is illustrated in the respective lower voltage-time graph.

As can be seen by means of the graphs shown in FIGS. 7A and 7B, the negative amplitude of a switch-off voltage signal which can be applied to the control electrode can be varied from 0 V to −2 V by virtue of the provision of the bias capacitor 8 and therefore a negative switch-off voltage can be provided. The duration of the provision of the negative switch-off voltage can in this case be advantageously shortened in comparison with the duration of the circuit arrangement shown in FIG. 5A by the provision of the first electrical resistor 9.

FIGS. 8A to 11B show voltage-time graphs for the further sets of parameters, wherein again an overview of the characteristic of the voltage over time in a time interval of 2 ms and a detail view of the time interval of 200 μs are shown.

As is shown with FIGS. 8A to 11B, the duration for the provision of the negative switch-off voltage can be reduced if the resistance of the resistor and/or the capacitance are reduced. However, this results in increased loading of the driver circuit. Therefore, a trade-off between the mentioned parameters is necessary.

What is claimed is:

1. A circuit arrangement for actuating a first voltage-controlled semiconductor switching element comprising a first electrode, a second electrode, and a control electrode, the circuit arrangement comprising:

a pulse generator configured to generate a control voltage input signal for actuating the first semiconductor switching element, wherein the control voltage input signals contain a switch-on voltage signal for switching on the first semiconductor switching element and a switch-off voltage signal for switching off the first semiconductor switching element, a bias capacitor electrically connected to the pulse generator such that the bias capacitor is configured to vary an amplitude of a switch-off voltage signal to the control electrode, a first electrical resistor connected electrically in series with the bias capacitor in an electrical path between a first connection of the pulse generator and a second connection of the pulse generator, wherein the control electrode is electrically connected to a first connection of the bias capacitor and to a first connection of the first electrical resistor, and wherein the first electrode is electrically connected to a second connection of the pulse generator and to a second connection of the first electrical resistor, and a further capacitor, which is connected electrically in series with the first electrical resistor and the bias capacitor in the line electrical path between the first connection of the pulse generator and the second connection of the pulse generator.

2. The circuit arrangement of claim 1, wherein the bias capacitor is configured to vary the amplitude of the switch-off voltage signal to the control electrode such way that the switch-off voltage signal has a polarity which is opposite that of a switch-on voltage signal.

3. The circuit arrangement of claim 1, further comprising a first diode connected electrically in series with the first electrical resistor and the bias capacitor in the electrical path between the first connection of the pulse generator and the second connection of the pulse generator.

4. The circuit arrangement of claim 3, wherein the first electrical resistor and the first diode are integrated monolithically in the circuit arrangement.

5. The circuit arrangement of claim 1, wherein the bias capacitor has a first capacitance $C_1$ and the capacitor has a third capacitance $C_3$ that substantially corresponds to the first capacitance.

6. The circuit arrangement of claim 1, wherein the first semiconductor switching element comprises a MOSFET, and wherein the first electrode forms a source electrode, the second electrode forms a drain electrode and the control electrode forms a gate electrode of the MOSFET.

7. The circuit arrangement of claim 1, wherein the first semiconductor switching element comprises an IGBT, and wherein the first electrode forms an emitter electrode, the second electrode forms a collector electrode and the control electrode forms a gate electrode of the IGBT.

8. The circuit arrangement of claim 1, further comprising a discharge circuit configured to discharge the control electrode, wherein the discharge circuit is connected electrically in parallel with the bias capacitor and has a second electrical resistor and a second semiconductor switching element.

9. The circuit arrangement of claim 1, further comprising a second diode connected electrically in parallel with the bias capacitor, wherein the first electrical resistor is connected electrically in series with the parallel circuit comprising the second diode and the bias capacitor in the electrical path between the first connection of the pulse generator and the second connection of the pulse generator.

10. The circuit arrangement of claim 9, wherein the second diode comprises a Zener diode.

11. A power converter, comprising:
a circuit arrangement for actuating a first voltage-controlled semiconductor switching element comprising a first electrode, a second electrode, and a control electrode, the circuit arrangement comprising:

a Pulse generator configured to generate a control voltage input signal for actuating the first semiconductor switching element, wherein the control voltage input signals contain a switch-on voltage signal for switching on the first semiconductor switching element and a switch-off voltage for switching off the first semiconductor switching element, a bias capacitor electrically connected to the pulse generator such that the bias capacitor is configured to vary an amplitude of a switch-off voltage signal to the control electrode, a first electrical resistor connected electrically in series with the bias capacitor in an electrical path between a first connection of the pulse generator and a second connection of the pulse generator, wherein the control electrode is electrically connected to a first connection of the bias capacitor and to a first connection of the first electrical resistor, and wherein the first electrode is electrically connected to a second connection of the pulse generator and to a second connection of the first electrical resistor, and a further capacitor connected electrically in series with the first electrical resistor and the bias capacitor in the electrical path between the first connection of the pulse generator and the second connection of the pulse generator.

12. The power converter of claim 11, wherein the bias capacitor is configured to vary the amplitude of the switch-off voltage signal to the control electrode such way that the switch-off voltage signal has a polarity which is opposite that of a switch-on voltage signal.

13. The power converter of claim 11, further comprising a first diode connected electrically in series with the first electrical resistor and the bias capacitor in the electrical path between the first connection of the pulse generator and the second connection of the pulse generator.

14. The power converter of claim 13, wherein the first electrical resistor and the first diode are integrated monolithically in the circuit arrangement.

15. The power converter of claim 11, wherein the bias capacitor has a first capacitance $C_1$ and the capacitor has a third capacitance $C_3$ that substantially corresponds to the first capacitance $C_1$.

16. The power converter of claim 11, wherein the first semiconductor switching element comprises a MOSFET, and wherein the first electrode forms a source electrode, the second electrode forms a drain electrode and the control electrode forms a gate electrode of the MOSFET.

17. The power converter of claim 11, wherein the first semiconductor switching element comprises an IGBT, and wherein the first electrode forms an emitter electrode, the second electrode forms a collector electrode and the control electrode forms a gate electrode of the IGBT.

18. The power converter of claim 11, further comprising a discharge circuit configured to discharge the control electrode, wherein the discharge circuit is connected electrically in parallel with the bias capacitor and has a second electrical resistor and a second semiconductor switching element.

19. The power converter of claim 11, further comprising a second diode connected electrically in parallel with the bias capacitor, wherein the first electrical resistor is connected electrically in series with the parallel circuit comprising the second diode and the bias capacitor in the electrical path between the first connection of the pulse generator and the second connection of the pulse generator.

20. The power converter of claim 19, wherein the second diode comprises a Zener diode.

* * * * *